US012772629B2

(12) United States Patent
Gahagan et al.

(10) Patent No.: US 12,772,629 B2
(45) Date of Patent: Oct. 20, 2026

(54) DISPLAYS INCLUDING MICROSTRUCTURES AND METHODS FOR FABRICATING THE DISPLAYS

(71) Applicant: CORNING INCORPORATED, Corning, NY (US)

(72) Inventors: Kevin Thomas Gahagan, Painted Post, NY (US); Dmitri Vladislavovich Kuksenkov, Elmira, NY (US); Shenping Li, Painted Post, NY (US)

(73) Assignee: CORNING INCORPORATED, Corning, NY (US)

(*) Notice: Subject to any disclaimer, the term of this patent is extended or adjusted under 35 U.S.C. 154(b) by 357 days.

(21) Appl. No.: 18/684,344

(22) PCT Filed: Aug. 23, 2022

(86) PCT No.: PCT/US2022/041193
§ 371 (c)(1),
(2) Date: Feb. 16, 2024

(87) PCT Pub. No.: WO2023/038789
PCT Pub. Date: Mar. 16, 2023

(65) Prior Publication Data

US 2025/0031499 A1 Jan. 23, 2025

Related U.S. Application Data

(60) Provisional application No. 63/242,772, filed on Sep. 10, 2021.

(51) Int. Cl.
*H10H 20/855* (2025.01)
*H10H 20/01* (2025.01)
(Continued)

(52) U.S. Cl.
CPC ........ *H10H 20/855* (2025.01); *H10H 20/018* (2025.01); *H10H 29/142* (2025.01); *H10W 72/0198* (2026.01); *H10W 90/00* (2026.01)

(58) Field of Classification Search
CPC .. H10H 20/855; H10H 20/018; H10H 29/142; H10W 90/00; H10W 72/0198
See application file for complete search history.

(56) References Cited

U.S. PATENT DOCUMENTS 6,504,981 B1 1/2003 Morley et al.
6,871,982 B2 3/2005 Holman et al.
(Continued)

FOREIGN PATENT DOCUMENTS

CN 109256455 A 1/2019
KR 10-2009-0040968 A 4/2009
(Continued)

OTHER PUBLICATIONS

International Search Report and Written Opinion of the International Searching Authority; PCT/US2022/041193; dated Dec. 16, 2022; 9 pages; Korean Patent Office.
(Continued)

*Primary Examiner* — Alonzo Chambliss
(74) *Attorney, Agent, or Firm* — Matthew J. Mason

(57) ABSTRACT

A display includes a backplane, an array of light sources coupled to the backplane, and a cover plate arranged over the array of light sources. The cover plate includes a first side facing the array of light sources and a second side opposite to the first side. The cover plate includes a microstructure layer and an absorption layer. The microstructure layer is arranged on the first side of the cover plate. The absorption layer is arranged on the microstructure layer facing the array of light sources.

11 Claims, 14 Drawing Sheets

(51) Int. Cl.

| | |
|---|---|
| ***H10H 29/14*** | (2025.01) |
| ***H10W 72/00*** | (2026.01) |
| ***H10W 90/00*** | (2026.01) |

(56) References Cited

U.S. PATENT DOCUMENTS

| | | | | |
|---|---|---|---|---|
| 9,035,279 | B2 * | 5/2015 | Hu | H10H 20/857 438/26 |
| 2004/0218390 | A1 | 11/2004 | Holman et al. | |
| 2010/0013741 | A1 | 1/2010 | Watanabe | |
| 2014/0232728 | A1 | 8/2014 | Eakin | |
| 2016/0351539 | A1 | 12/2016 | Bower et al. | |
| 2017/0373282 | A1 | 12/2017 | Kim et al. | |
| 2019/0221780 | A1 | 7/2019 | Ishikawa et al. | |
| 2020/0105968 | A1 | 4/2020 | Lutgen | |
| 2021/0047235 | A1 | 2/2021 | Kanungo et al. | |
| 2021/0202913 | A1 | 7/2021 | Bowden et al. | |
| 2021/0234131 | A1 | 7/2021 | Kuksenkov et al. | |

FOREIGN PATENT DOCUMENTS

| | | | |
|---|---|---|---|
| KR | 10-2010-0066416 | A | 6/2010 |
| KR | 10-2015-0120487 | A | 10/2015 |
| KR | 10-1793542 | B1 | 11/2017 |
| KR | 10-2018-0002115 | A | 1/2018 |
| KR | 10-2020-0119858 | A | 10/2020 |
| TW | 202011051 | A | 3/2020 |
| WO | 2019/086903 | A1 | 5/2019 |
| WO | 2022/212635 | A1 | 10/2022 |

OTHER PUBLICATIONS

Taiwanese Patent Application No. 111133677, Office Action dated Feb. 14, 2026, 2 pages (English Translation only), Taiwanese Patent Office.

Korean Patent Application No. 10-2024-7011061, Office Action dated Feb. 10, 2026, 4 pages (English Translation only), Korean Patent Office.

* cited by examiner

DISPLAYS INCLUDING MICROSTRUCTURES AND METHODS FOR FABRICATING THE DISPLAYS

CROSS-REFERENCE TO RELATED APPLICATIONS

This is a national stage application under 35 U.S.C. § 371 of International Application No. PCT/US2022/041193, filed on Aug. 23, 2022, which claims the benefit of priority under 35 U.S.C. § 119 of U.S. Provisional Application Ser. No. 63/242,772 filed on Sep. 10, 2021, which is incorporated herein by reference in their entireties.

BACKGROUND

Field

The present disclosure relates generally to displays. More particularly, it relates to displays including microstructures for improving display brightness and contrast.

Technical Background

Light emitting diode (LED) displays, such as mini-LED or microLED displays, are emerging as a competitive emission display technology with advantages of higher brightness, improved efficiency, and thermal stability. The small emitter area of microLEDs may achieve high ambient contrast by suppressing ambient reflections outside of the emission area while allowing light emitted from the microLEDs to pass out of the display. Emission from microLEDs, however, is typically non-uniform and over a wide angular range, resulting in a significant amount of optical energy trapped and absorbed within the display structure.

SUMMARY

Some embodiments of the present disclosure relate to a display. The display includes a backplane, an array of light sources coupled to the backplane, and a cover plate arranged over the array of light sources. The cover plate includes a first side facing the array of light sources and a second side opposite to the first side. The cover plate includes a microstructure layer and an absorption layer. The microstructure layer is arranged on the first side of the cover plate. The absorption layer is arranged on the microstructure layer facing the array of light sources.

Yet other embodiments of the present disclosure relate to a light emitting diode (LED) display. The LED display includes a backplane, an array of LEDs coupled to the backplane, an array of focusing microstructures, and a cover plate. The array of focusing microstructures is attached to the array of LEDs and aligned with the array of LEDs. The cover plate is attached to the array of focusing microstructures.

Yet other embodiments of the present disclosure relate to a display. The display includes a substrate, an array of light sources arranged on the substrate, a first microstructure layer, and a first absorption layer. The first microstructure layer is arranged on the substrate and surrounds the light sources of the array of light sources. The first absorption layer is arranged on the first microstructure layer.

Yet other embodiments of the present disclosure relate to a method for fabricating a display. The method includes forming an array of focusing microstructures on a transfer carrier. The method includes transferring selected light sources from a light source wafer to permanently bond a first surface of each focusing microstructure of the array of focusing microstructures to the selected light sources. The method includes removing the transfer carrier from the array of focusing microstructures. The method includes permanently bonding a second surface of each focusing microstructure of the array of focusing microstructures to a cover plate, wherein the second surface is opposite to the first surface.

Yet other embodiments of the present disclosure relate to a transfer carrier. The transfer carrier includes a substrate, a temporary adhesive layer attached to the substrate, and an array of focusing microstructures. Each focusing microstructure includes a first surface attached to the temporary adhesive layer.

The microstructure layers, absorption layers, and focusing microstructures enhance light extraction from top or bottom emission light sources (e.g., LEDs, mini-LEDs, microLEDs) and improve contrast. The microstructure layer and the absorption layer within the displays suppress ambient light reflection (e.g., by up to about 100 times) by trapping incident light in the cover plate by total internal reflection (TIR) and/or by increasing the number of interactions of incident light with the microstructure layer and the absorption layer. The microstructure layer and the absorption layer also provide a surface compatible with LED (e.g., mini-LED, microLED) display fabrication processes. The focusing microstructures direct light from light sources forward and homogenize and increase light exiting the display. The focusing microstructures also trap ambient light and direct the ambient light to absorbing regions of the display. The focusing microstructures may include colorants or color filter elements to absorb light other than the emitting wavelength, further enhancing contrast and improving color purity. The display fabrication processes enable fabrication and alignment of the focusing microstructures using a transfer process, thereby improving alignment and bonding of the light sources with the focusing microstructures. In addition, the displays may be fabricated directly on a finished cover glass component, saving cost, improving mechanical reliability, and providing a thin form factor.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary and are intended to provide an overview or framework to understanding the nature and character of the claims. The accompanying drawings are included to provide a further understanding and are incorporated in and constitute a part of this specification. The drawings illustrate one or more embodiment(s), and together with the description explain principles and operation of the various embodiments.

DETAILED DESCRIPTION

Figure 1A:
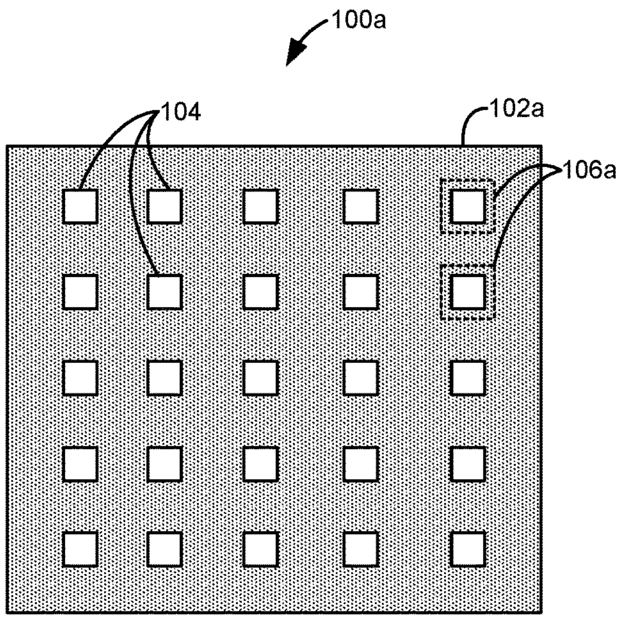
FIGS. 1A-1D are top views of exemplary arrangements of light sources electrically coupled to a backplane.

Reference will now be made in detail to embodiments of the present disclosure, examples of which are illustrated in the accompanying drawings. Whenever possible, the same reference numerals will be used throughout the drawings to refer to the same or like parts. However, this disclosure may be embodied in many different forms and should not be construed as limited to the embodiments set forth herein.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom, vertical, horizontal—are made only with reference to the figures as drawn and are not intended to imply absolute orientation.

Unless otherwise expressly stated, it is in no way intended that any method set forth herein be construed as requiring that its steps be performed in a specific order, nor that with any apparatus, specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an," and "the" include plural references unless the context clearly dictates otherwise. Thus, for example, reference to "a" component includes aspects having two or more such components, unless the context clearly indicates otherwise.

MicroLED displays fabricated in a bottom emission design typically suffer from low brightness and poor image contrast in ambient light due to reflections from backplane structures (e.g., metal lines, thin-film transistors (TFTs), etc.) and light from microLEDs trapped within the substrate and other interface layers. The use of micro-driver IC backplanes, in place of TFTs, allows for an overall lower process temperature (e.g., about 200-250 degrees Celsius versus about 325-600 degrees Celsius), and opens the available set of materials, device designs, and process options for constructing bottom emission backplanes with improved optical performance and other design and cost benefits.

Emission from light sources (e.g., LEDs, mini-LEDs, microLEDs) is typically non-uniform and over a wide angular range, resulting in a significant amount of optical energy trapped and absorbed within the display structure. Hence, disclosed herein is an optimized optical design to homogenize and direct light out of the display. Focusing microstructures (e.g., inverted pyramid structures) and other optical enhancements are used to suppress ambient light reflection to improve light extraction and ambient contrast of displays in both top emitting and bottom emitting configurations. Further disclosed herein are methods for fabricating such display structures by incorporating optical features into a transfer process to enable high yield transfer with precise alignment.

Referring now to FIG. 1A, a top view of a portion of an exemplary display 100*a* is depicted. Display 100*a* includes a backplane 102*a* and an array of light sources 104 electrically coupled to the backplane 102*a*. Backplane 102*a* may include an array of TFTs, micro-driver integrated circuits (ICs), or other suitable circuitry electrically coupled to each light source 104 to control each light source. In this example, each pixel as indicated at 106*a* of the display 100*a* includes a single light source 104. The pixels 106*a* are arranged in rows and columns. While five rows and five columns of pixels 106*a* are illustrated in FIG. 1A, in other embodiments, the display 100*a* may include any suitable number of rows and any suitable number of columns of pixels 106*a*.

Each light source 104 may, for example, be an LED (e.g., size larger than about 0.5 millimeters), a mini-LED (e.g., size between about 0.1 millimeters and about 0.5 millimeters), a microLED (e.g., size smaller than about 0.1 millimeter), or another suitable light source having a wavelength ranging from about 400 nanometers to about 750 nanometers. In other embodiments, each of the plurality of light sources 104 may have a wavelength shorter than 400 nanometers and/or longer than 750 nanometers.

Figure 1B:
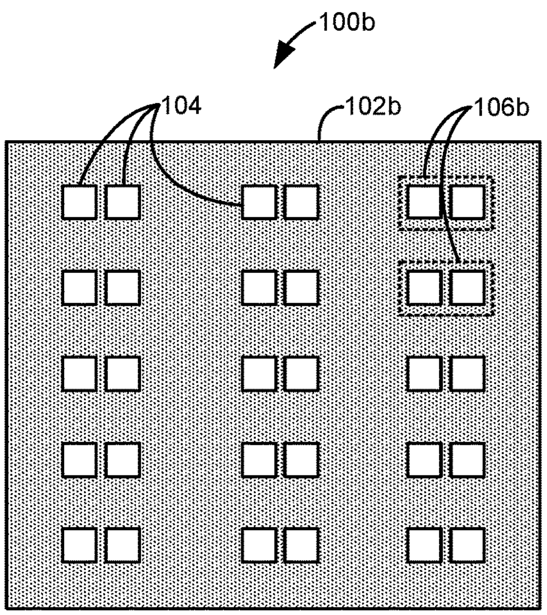

FIG. 1B is a top view of a portion of an exemplary display 100*b*. Display 100*b* includes a backplane 102*b* and an array of light sources 104 electrically coupled to the backplane 102*b*. Backplane 102*b* may include an array of TFTs, micro-driver ICs, or other suitable circuitry electrically coupled to each light source 104 to control each light source. In this example, each pixel as indicated at 106*b* of the display 100*b* includes two light sources 104 proximate each other. The two light sources 104 within each pixel 106*b* may have the same emission color or different emission colors. The pixels 106*b* are arranged in rows and columns. While five rows and three columns of pixels 106*b* are illustrated in FIG. 1B, in other embodiments, the display 100*b* may include any suitable number of rows and any suitable number of columns of pixels 106*b*.

Figure 1C:
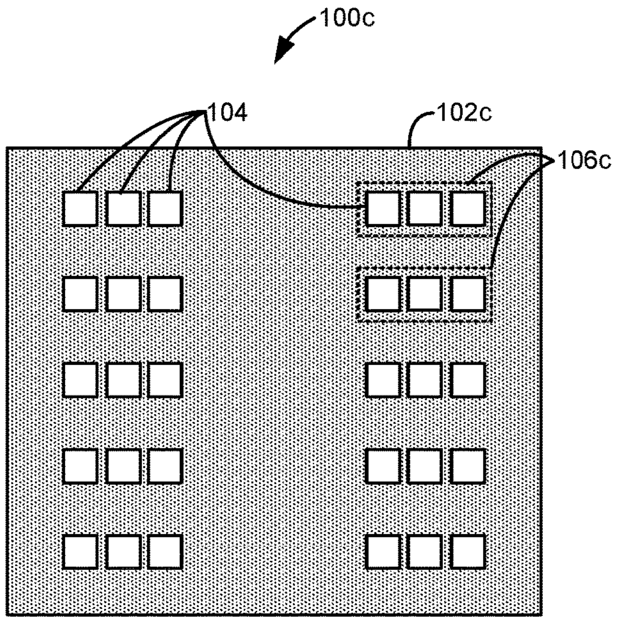

FIG. 1C is a top view of a portion of an exemplary display 100*c*. Display 100*c* includes a backplane 102*c* and an array of light sources 104 electrically coupled to the backplane 102*c*. Backplane 102*c* may include an array of TFTs, micro-driver ICs, or other suitable circuitry electrically coupled to each light source 104 to control each light source. In this example, each pixel as indicated at 106*c* of the display 100*c* includes three light sources 104 proximate each other. While the three light sources 104 of each pixel 106*c* are illustrated as being in a line, in other embodiments, the three light sources 104 of each pixel 106*c* may have another suitable arrangement. The three light sources 104 within each pixel 106*c* may have the same emission color or different emission colors. In certain exemplary embodiments, each pixel 106*c* may include a red light source, a green light source, and a blue light source. The pixels 106*c* are arranged in rows and columns. While five rows and two columns of pixels 106*c* are illustrated in FIG. 1C, in other embodiments, display 100*c* may include any suitable number of rows and any suitable number of columns of pixels 106*c*.

Figure 1D:
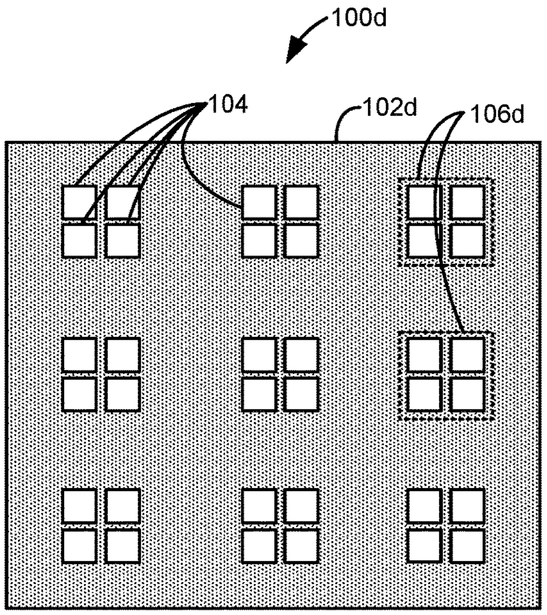

FIG. 1D is a top view of a portion of an exemplary display 100*d*. Display 100*d* includes a backplane 102*d* and an array of light sources 104 electrically coupled to the backplane 102*d*. Backplane 102*d* may include an array of TFTs, micro-driver ICs, or other suitable circuitry electrically coupled to each light source 104 to control each light source. In this example, each pixel as indicated at 106*d* of the display 100*d* includes four light sources 104 proximate each other. While the four light sources 104 of each pixel 106*d* are illustrated as being in a two by two array, in other embodiments, the four light sources 104 of each pixel 106*d* may have another suitable arrangement (e.g., in a single row). The four light sources 104 within each pixel 106*d* may have the same emission color or different emission colors. In certain exemplary embodiments, each pixel 106*d* may include a red light source, a green light source, a blue light source, and a yellow light source. The pixels 106*d* are arranged in rows and columns. While three rows and three columns of pixels 106*d* are illustrated in FIG. 1D, in other embodiments, display 100*d* may include any suitable number of rows and any suitable number of columns of pixels 106*d*.

While the embodiments illustrated in the following figures illustrate displays including pixels having a single light source as illustrated in FIG. 1A or three light sources as illustrated in FIG. 1C, the embodiments are also applicable to displays including pixels having two light sources as illustrated in FIG. 1B or four light sources as illustrated in FIG. 1D.

Figure 2A:
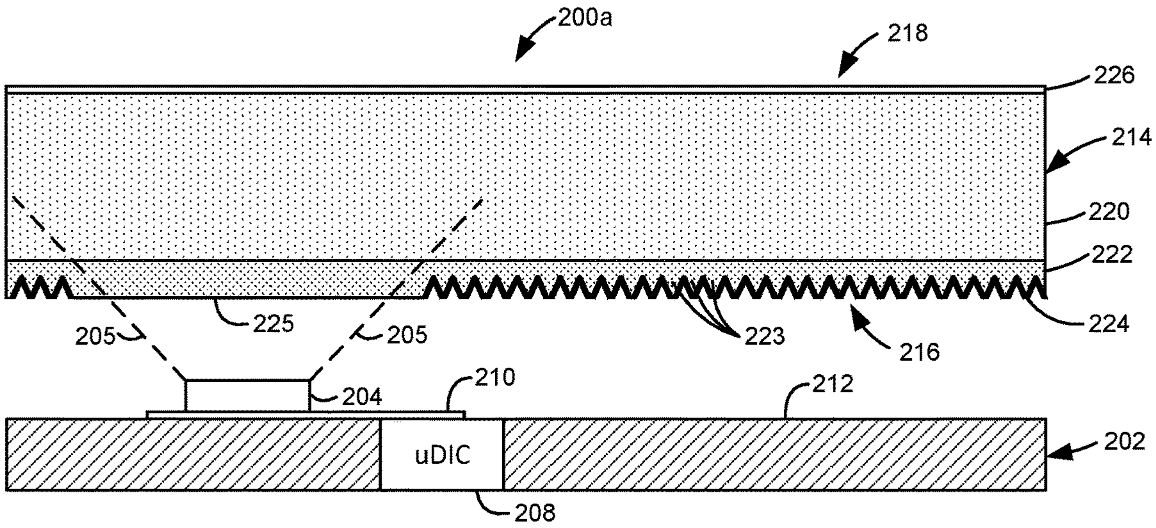
FIGS. 2A-2C are simplified cross-sectional views of exemplary displays including a microstructure layer and an absorption layer.

FIG. 2A is a simplified cross-sectional view of an exemplary display 200*a*. Display 200*a* includes a backplane 202, an array of light sources 204 (one light source 204 is visible in FIG. 2A), and a cover plate 214. The array of light sources 204 is electrically coupled to the backplane 202. In certain exemplary embodiments, the array of light sources 204 may include an array of LEDs, such as an array of mini-LEDs or microLEDs. In this embodiment, each light source 204 may be a bottom emission device.

Backplane 202 includes an array of micro-driver ICs (uDICs) 208 (one micro-driver IC 208 is visible in FIG. 2A) electrically coupled to the array of light sources 204 via a redistribution layer 210 to control each light source. Display 200*a* may include one micro-driver IC 208 electrically coupled to multiple light sources 204 (e.g., 2, 3, or 4 light sources) of the array of light sources or one micro-driver IC 208 electrically coupled to each light source 204 of the array of light sources. The micro-driver ICs 208 may be encapsulated by an encapsulation material and/or heat sink 212, and the redistribution layer 210 may be arranged on a surface of the encapsulation material and/or heat sink 212.

The cover plate 214 is arranged over the array of light sources 204. The cover plate 214 includes a first side 216 facing the array of light sources 204 and a second side 218 opposite to the first side 216. The cover plate 214 may include an optically clear layer 220, a microstructure layer 222, an absorption layer 224, and an anti-reflection coating 226. The optically clear layer 220 may include glass, such as aluminosilicate, alkali-aluminosilicate, borosilicate, alkali-borosilicate, aluminoborosilicate, alkali-aluminoborosilicate, soda lime, or other suitable glasses (e.g., Gorilla® glass, Ceramic Shield, EAGLE XG® glass) or another optically clear material, such as plastic (e.g., polymethyl methacrylate (PMMA), methylmethacrylate styrene (MS), polydimethylsiloxane (PDMS)). The microstructure layer 222 is arranged on the optically clear layer 220 on the first side 216 of the cover plate 214. The microstructure layer 222 may be the same material as the optically clear layer 220. The absorption layer 224 is arranged on the microstructure layer 222 facing the array of light sources 204. In this embodiment, the absorption layer 224 is a conformal absorption layer. The absorption layer 224 may be a thermally and chemically stable light absorbing material. In certain exemplary embodiments, the absorption layer 224 includes a black polyimide or another suitable material.

The microstructure layer 222 includes a plurality of microstructures 223, which will be described in more detail below with reference to FIGS. 3A-3C and 6A-6F. In some embodiments, the microstructure layer 222 is configured to confine a portion of ambient light reflected by the absorption layer 224 in the microstructure layer 222. The microstructure layer 222 includes areas 225 aligned with each light source 204 where the microstructures 223 are excluded. Also, the absorption layer 224 is excluded in areas 225 to allow light emitted by each light source 204, as indicated between dashed lines 205, to pass through the absorption layer 224 and the microstructure layer 222. The anti-reflection coating 226 is on the optically clear layer 220 on the second side 218 of the cover plate 214.

The cover plate 214 enhances the display contrast of the display 200*a*. In this embodiment, the microstructure layer 222 and the absorption layer 224 may be formed in such a way that microstructures 223 are formed in the areas without light sources 204 and not formed in areas 225 with light sources 204. In this embodiment, the microstructure layer 222 is transparent to visible light (e.g., about 400-750 nanometers) so that light from the light sources 204 can pass through the areas 225 to display images. The sizes and shapes of microstructures 223 may be the same over the entire cover plate 214, or may vary from one area to another area of the cover plate 214. The microstructures 223 may be periodically or randomly distributed over the cover plate 214.

The microstructure layer 222 may be a clear or neutral density layer patterned with microstructures 223 and subsequently coated with the absorbing layer 224. The microstructures 223 enhance absorption of light through trapping incident light in cover plate 214 by total internal reflection (TIR) and multiple interactions with the absorption layer 224. The absorption layer 224 may include a thermally and chemically stable light absorbing material coated on the entire microstructure layer 222 to a thickness of several micrometers to tens of micrometers. The absorption layer 224 may then be selectively etched in areas 225 to allow light transmission from the light sources 204. The use of black polyimide for absorption layer 224 offers the advantage of being stable to processes for fabricating the display, while enhancing contrast, and if desired, allowing for fabrication of a bottom emission flexible display device by laser lift-off techniques.

Figure 2B:
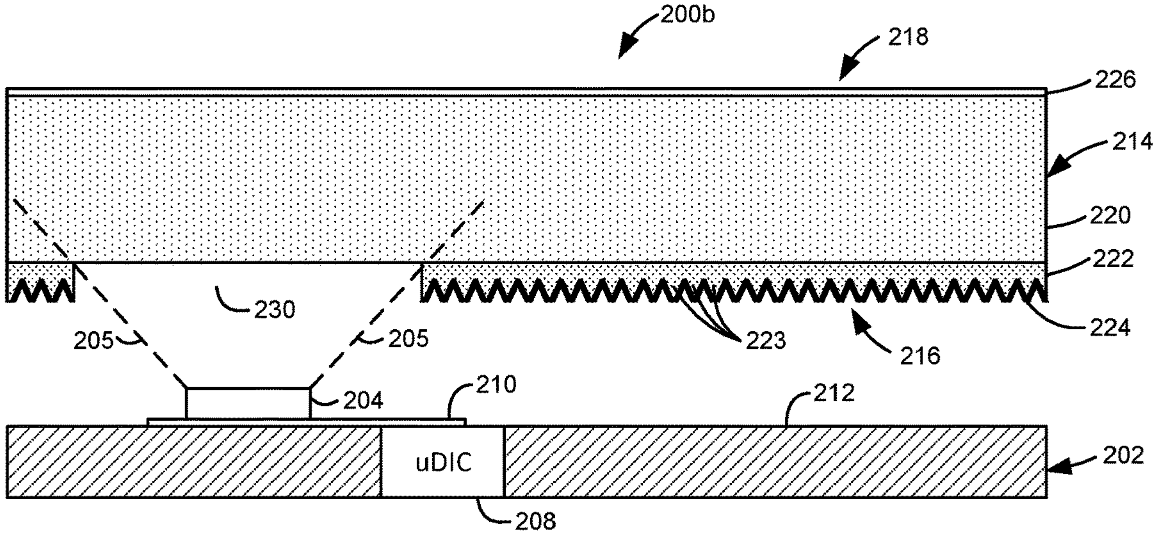

FIG. 2B is a simplified cross-sectional view of an exemplary display 200*b*. Display 200*b* is similar to display 200*a* of FIG. 2A, except that for display 200*b*, cover plate 214 includes an array of openings 230 (one opening 230 is visible in FIG. 2B). The array of openings 230 are aligned with the array of light sources 204. Each opening 230 extends through the microstructure layer 222 and the absorption layer 224. Thus, the openings 230 in microstructure layer 222 and absorption layer 224 allow light emitted by each light source 204, as indicated between dashed lines 205, to pass through the microstructure layer 222 and the absorption layer 224.

In this embodiment, the microstructure layer 222 and the absorption layer 224 may be formed in such a way that the microstructures 223 are first formed on all areas of the cover plate 214, the absorption layer is applied to the microstructures 223, and then the microstructure layer 222 and the absorption layer 224 in areas 230 is removed (e.g., via etching or laser ablation) so that light from the light sources 204 can pass through the areas 230 to display images. In this embodiment, the microstructure layer 222 may be transparent or non-transparent to visible light.

Figure 2C:
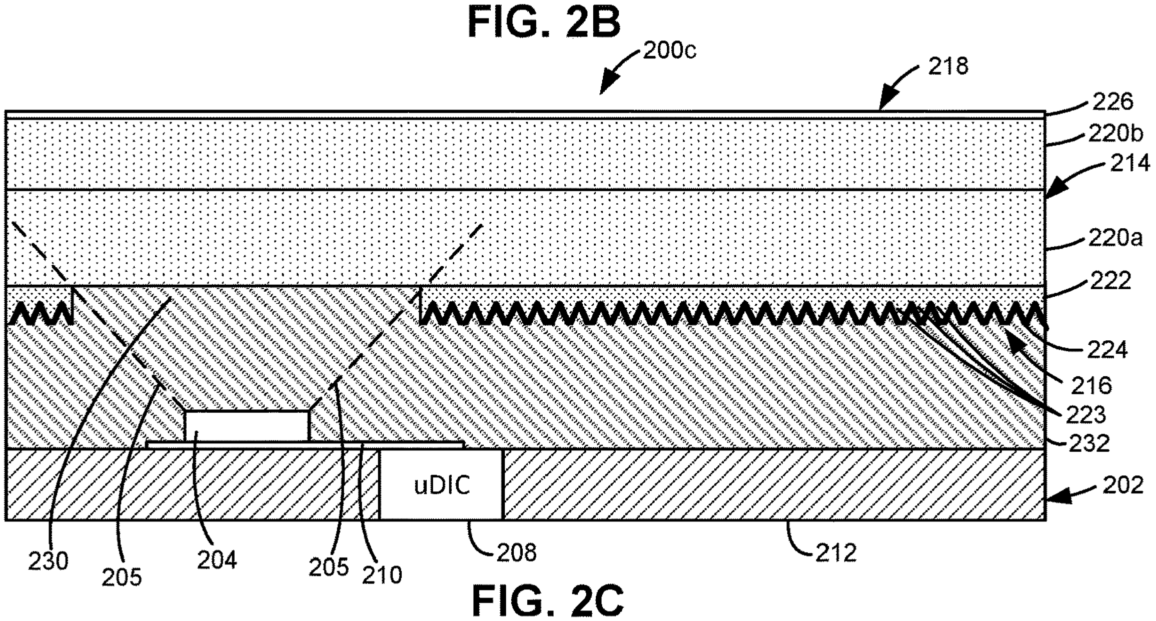

FIG. 2C is a simplified cross-sectional view of an exemplary display 200*c*. Display 200*c* is similar to display 200*b* of FIG. 2B, except that display 200*c* includes a planarization layer 232 and the cover plate 214 includes an optically clear laminate structure. The optically clear laminate structure includes a first optically clear layer 220*a* and a second optically clear layer 220*b*. While display 200*c* illustrates two optically clear layers 220*a* and 220*b*, in other embodiments, display 200*c* may include more than two optically clear layers, such as three or more optically clear layers. Layers 220*a* and 220*b* may include the same material or different materials and may be directly fused to each other or attached to each other via an optically clear adhesive. The planarization layer 232 is between the cover plate 214 and the backplane 202 and fills the space between the cover plate 214 and the backplane 202. The planarization layer 232 includes an optically clear material. In this embodiment, the redistribution layer 210 may be formed on the planarization layer 232.

Figure 3A:
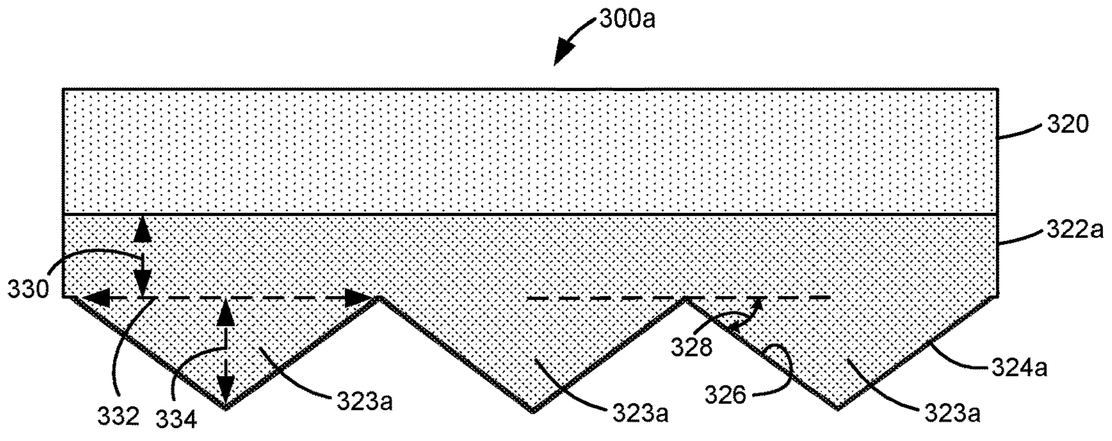
FIGS. 3A-3C are cross-sectional views of exemplary microstructure layers and absorption layers as could be used in the displays of FIGS. 2A-2C.

FIG. 3A is a cross-sectional view of a portion of an exemplary cover plate 300*a*. In some embodiments, cover plate 300*a* may provide cover plate 214 of FIGS. 2A-2C. Cover plate 300*a* includes an optically clear layer 320, a microstructure layer 322*a*, and an absorption layer 324*a*. The optically clear layer 320 may include glass or another optically clear material, such as plastic. The microstructure layer 322*a* is arranged on the optically clear layer 320. The microstructure layer 322*a* may be the same material as the optically clear layer 320. The absorption layer 324*a* is arranged on the microstructure layer 322*a*. In this embodiment, the absorption layer 324*a* is a conformal absorption layer. In certain exemplary embodiments, the absorption layer 324*a* includes a black polyimide or another suitable material. The microstructure layer 322*a* includes a plurality of microstructures 323*a*, which will be described in more detail below with reference to FIGS. 6A-6C and 6E. In this embodiment, the microstructures 323*a* are pyramids, cones, or triangular trenches.

The microstructure layer 322*a* and the absorption layer 324*a* in non-light source areas may further reduce ambient light reflection from a display by utilizing TIR in the interfaces of the layers in the cover plate and by multiple light bouncing (e.g., trapping light) in the microstructures 323*a*. In one embodiment, the refractive index ($n_1$) of optically clear layer 320 is equal to or greater than the refractive index ($n_2$) of microstructure layer 322*a*. In this case, some ambient light reflected by the absorption layer 324*a* can be confined in the optically clear layer 320 by TIR in the interface between a front surface (e.g., top surface) of the optically clear layer 320 and air when the wall angle 328 ($\alpha_W$) of the microstructures 323*a* satisfies:

$$\alpha_W > \arcsin(1/n_2)$$

In addition, some ambient light bounces multiple times (e.g., is trapped) in the microstructures 323*a*.

In another embodiment, the refractive index ($n_1$) of the optically clear layer 320 is less than the refractive index ($n_2$) of the microstructure layer 322*a*. In this case, some ambient light reflected by the absorption layer 323*a* can be confined in the optically clear layer 320 by TIR in the interface between a front surface (e.g., top surface) of the optically clear layer 320 and air when the wall angle 328 ($\alpha_W$) of the microstructures 323*a* satisfies:

$$\alpha_W > \arcsin(1/n_2)$$

In addition, some ambient light reflected by the absorption layer 324*a* can be confined in the microstructure layer 322*a* by TIR in the interface between optically clear layer 320 and microstructure layer 322*a* when the wall angle 328 ($\alpha_W$) of microstructures 323*a* satisfies:

$$\alpha_W > \arcsin(n_1/n_2)$$

In addition, some ambient light may bounce multiple times (e.g., is trapped) in the microstructures 323*a*. In certain exemplary embodiments, such features may reduce reflectance in comparison to a planar absorbing interface by at least five to ten times due to reflected rays interacting multiple times with the absorbing interface.

For microstructures with straight cross-section wall surfaces (e.g., pyramids, cones, or triangle trenches) as illustrated in FIG. 3A, the microstructure layer 322 may include microstructures 323*a* including surfaces 326 that form an angle 328 to a plane of a surface of the display greater than, for example, about 45 degrees. In certain exemplary embodiments, the microstructure wall angle 328 ($\alpha_W$) is greater than about 30 degrees, greater than about 45 degrees, greater than about 60 degrees, or greater than about 75 degrees. The microstructure layer 322*a* may have a base layer thickness 330 between about 0.1 micrometers and about 10 micrometers on which the microstructures 323*a* are formed. A base of each microstructure 323*a* may have a width as indicated at 332, for example, within a range between about 2 micrometers and about 20 micrometers. A height of each microstructure 323*a* as indicated at 334 may be within a range between about 2 micrometers and about 40 micrometers. In other embodiments, the microstructure base layer thickness 330 may have another suitable thickness, and each microstructure 323*a* may have another suitable base width 332 and/or height 334.

Figure 3B:
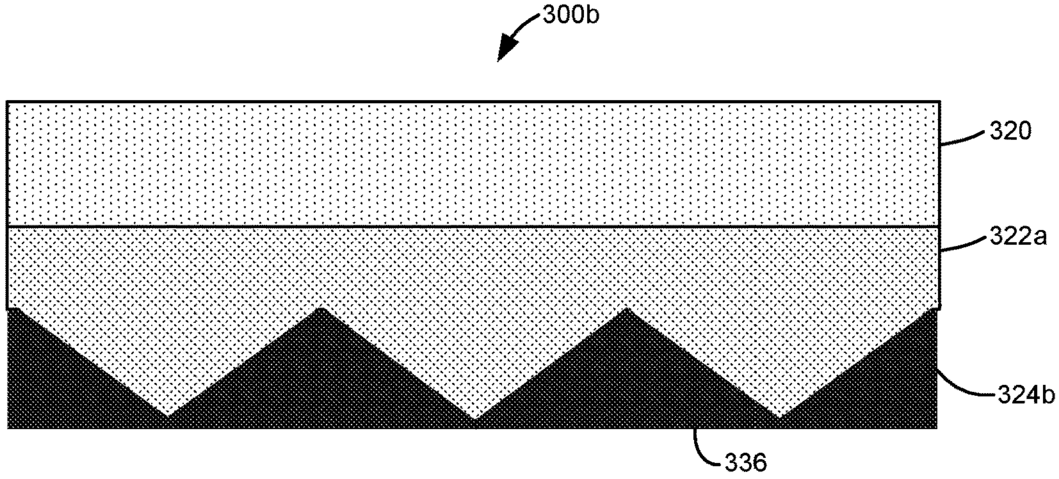

FIG. 3B is a cross-sectional view of a portion of an exemplary cover plate 300*b*. In some embodiments, cover plate 300*b* may provide cover plate 214 of FIGS. 2A-2C. Cover plate 300*b* is similar to cover plate 300*a* of FIG. 3A, except that cover plate 300*b* includes an absorption layer 324*b* in place of absorption layer 324*a*. In this embodiment, the absorption layer 324*b* fills the microstructure layer 322*a* such that a surface 336 of the absorption layer facing the array of light sources is planar. In this embodiment, the absorption layer 324*b* provides a smooth surface for easier fabrication of additional device layers.

Figure 3C:
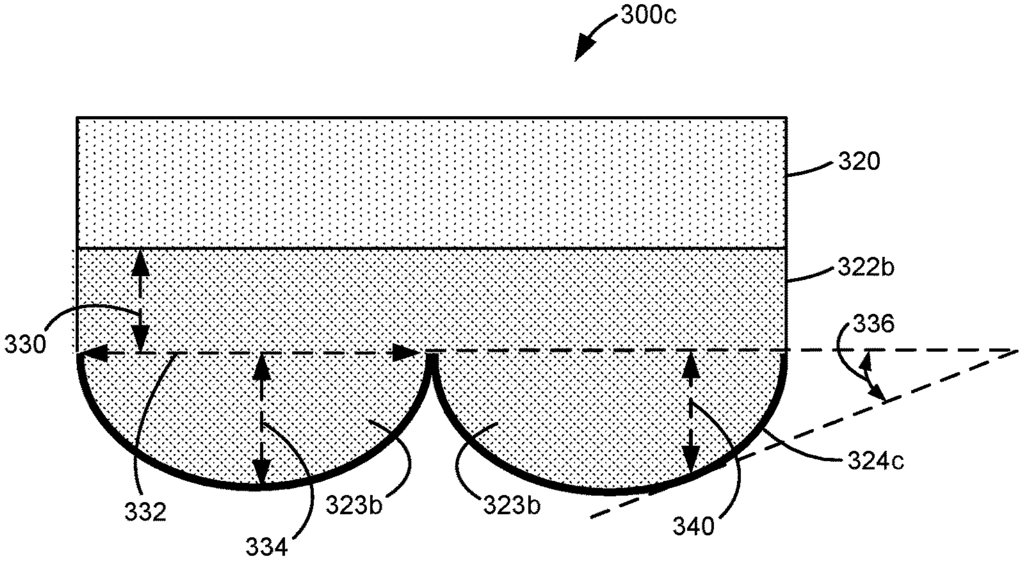

FIG. 3C is a cross-sectional view of a portion of an exemplary cover plate 300*c*. In some embodiments, cover plate 300*c* may provide cover plate 214 of FIGS. 2A-2C. Cover plate 300*c* includes an optically clear layer 320, a microstructure layer 322*b*, and an absorption layer 324*c*. The microstructure layer 322*b* is arranged on the optically clear layer 320. The absorption layer 324*c* is arranged on the microstructure layer 322*b*. In this embodiment, the absorption layer 324*c* is a conformal absorption layer. In certain exemplary embodiments, the absorption layer 324*c* includes a black polyimide or another suitable material. The microstructure layer 322*b* includes a plurality of microstructures 323*b*, which will be described in more detail below with reference to FIGS. 6D and 6F. In this embodiment, the microstructures 323*b* are domes or partial elliptical trenches.

The microstructure layer 322*b* may have a base layer thickness 330 between about 0.1 micrometers and about 10 micrometers on which the microstructures 323*b* are formed. A base of each microstructure 323*b* may have a width as indicated at 332, for example, within a range between about 2 micrometers and about 20 micrometers. A height ($H_m$) of each microstructure 323*b* as indicated at 334 may be within a range between about 2 micrometers and about 40 micrometers. In other embodiments, the microstructure base layer thickness 330 may have another suitable thickness, and each microstructure 323*b* may have another suitable base width 332 and/or height 334 ($H_m$). For microstructures with non-straight cross-section wall surfaces (e.g., domes or partial elliptical trenches) as illustrated in FIG. 3C, the microstructure wall angle ($\alpha_W$) is defined by the surface slope at the location of ⅔ height ($H_m$) of a microstructure as indicated at 340. The angle 336 between the location at $2H_m/3$ and a plane of a surface of the display may be greater than, for example, about 45 degrees. In certain exemplary embodiments, the microstructure wall angle 336 ($\alpha_W$) is greater than about 30 degrees, greater than about 45 degrees, greater than about 60 degrees, or greater than about 75 degrees.

Figure 4A:
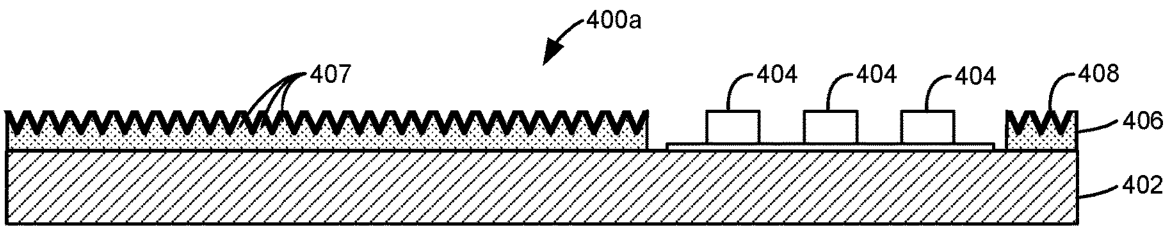
FIGS. 4A-4C are simplified cross-sectional views of other exemplary displays including a microstructure layer and an absorption layer.

FIG. 4A is a cross-sectional view of another exemplary display 400*a*. The embodiments discussed above with regard to bottom emission devices, can also be applied to top emission devices with some modifications to the designs and processes. For a top emission device, the primary difference is that the backplane and light sources (e.g., LEDs, mini-LEDs, microLEDs) are fabricated on a separate TFT substrate. Display 400*a* includes a substrate 402 (e.g., TFT substrate), an array of light sources 404 arranged in pixels (one pixel including three light sources 404 is visible in FIG. 4A), a microstructure layer 406, and an absorption layer 408. The array of light sources 404 are arranged on the substrate 402. In certain exemplary embodiments, the array of light sources 404 includes an array of LEDs, such as mini-LEDs or microLEDs. The microstructure layer 406 is arranged on the substrate 402 and surrounds the light sources 404 (e.g., each group of light sources 404 providing a pixel). The microstructure layer 406 includes a plurality of microstructures 407. The absorption layer 408 is arranged on the microstructure layer 406. In this embodiment, the absorption layer 408 is a conformal absorption layer. In certain exemplary embodiments, the absorption layer 408 includes a black polyimide or another suitable material. The microstructure layer 406 and the absorption layer 408 are formed on the surface of the substrate 402 in the areas without light sources 404. In this embodiment, the materials of the microstructure layer 406 and the absorption layer 408 can be either the same or different. The microstructure layer 406 and the absorption layer 408 may enhance the contrast of a top-emission (e.g., microLED) display.

Figure 4B:
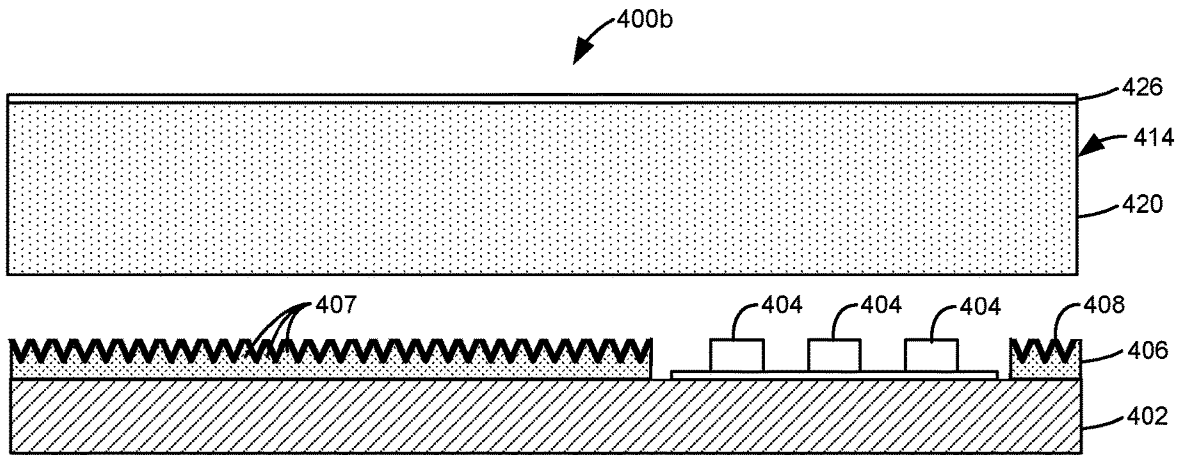

FIG. 4B is a cross-sectional view of another exemplary display 400*b*. Display 400*b* includes the substrate 402, the array of light sources 404, the microstructure layer 406, and the absorption layer 408 of FIG. 4A. In addition, display 400*b* includes a cover plate 414 arranged over the array of light sources 404. The cover plate 414 includes an optically clear layer 420 and an anti-reflection coating 426.

Figure 4C:
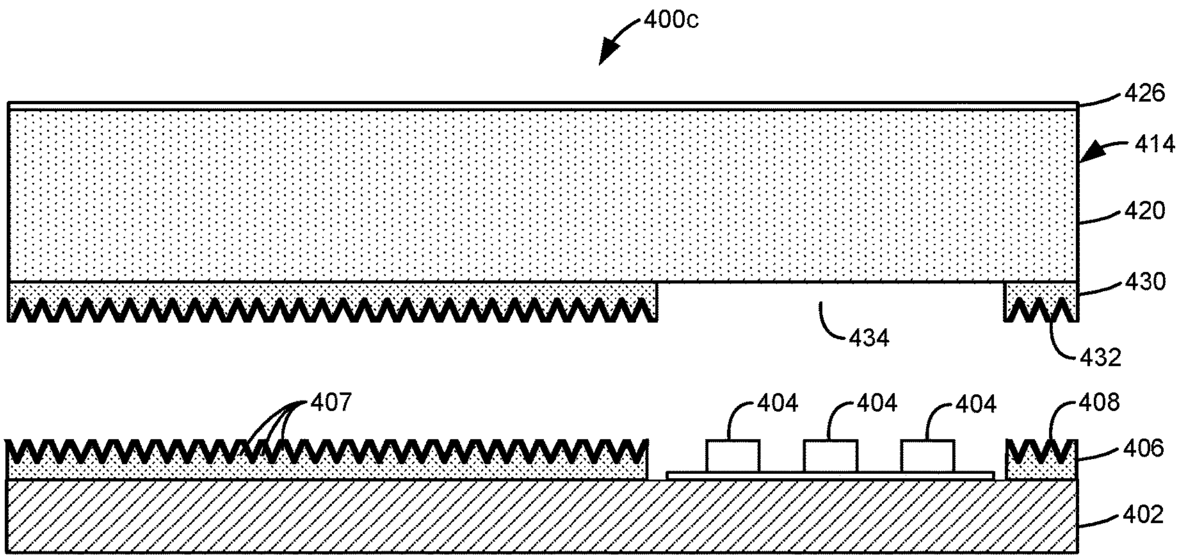

FIG. 4C is a cross-sectional view of another exemplary display 400*c*. Display 400*c* is similar to display 400*b* of FIG. 4B including a (first) microstructure layer 406 and a (first) absorption layer 408. In display 400*c*, however, the cover plate 414 also includes a second microstructure layer 430, a second absorption layer 432, and an array of openings 434 (one opening 434 is visible in FIG. 4C). The second microstructure layer 430 faces the array of light sources 404. The second absorption layer 432 is arranged on the second microstructure layer 430 facing the array of light sources 404. The array of openings 434 are aligned with the array of light sources 404 (e.g., each group of light sources 404 providing a pixel) and extend through the second microstructure layer 430 and the second absorption layer 432. Second microstructure layer 430 and second absorption layer 432 may be similar to the microstructure layer and absorption layer described with reference to FIGS. 3A-3C.

Figure 5A:
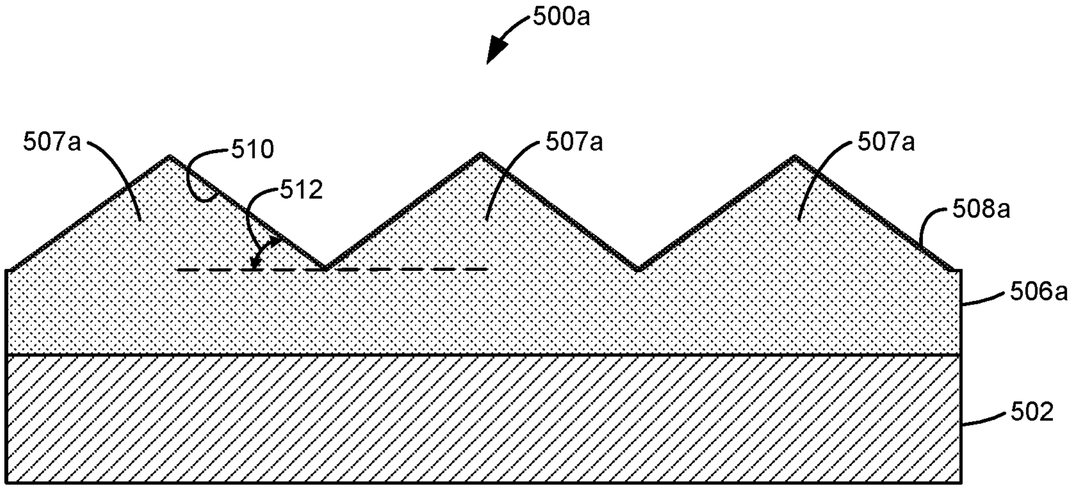
FIGS. 5A and 5B are cross-sectional views of exemplary microstructure layers and absorption layers as could be used in the displays of FIGS. 4A-4C.

FIG. 5A is a cross-sectional view of a portion of an exemplary display 500*a* including a substrate 502 (e.g., TFT substrate), a microstructure layer 506*a*, and an absorption layer 508*a* as could be used in the displays of FIGS. 4A-4C. In certain exemplary embodiments, the absorption layer 508*a* includes a black polyimide or another suitable material. The microstructure layer 506*a* includes a plurality of microstructures 507*a*, which will be described in more detail below with reference to FIGS. 6A-6C and 6E. The microstructure layer 506*a* is arranged on the substrate 502. The absorption layer 508*a* is arranged on the microstructure layer 506*a*. In this embodiment, the absorption layer 508*a* is a conformal absorption layer. In this embodiment, the microstructures 507*a* are pyramids, cones, or triangular trenches. The microstructure layer 506*a* includes microstructures 507*a* including surfaces 510 that form an angle 512 to a plane of a surface of the display greater than, for example, about 45 degrees. The dimensions of microstructure layer 506*a* including microstructures 507*a* may be similar to the dimensions of microstructure layer 322*a* and microstructures 323*a* of FIG. 3A.

The microstructure layer 506*a* and the absorption layer 508*a* on the substrate 502 may further reduce ambient light reflection from a display by utilizing the microstructures 507*a*. The reflected ambient light may be categorized by two groups. The first group is ambient light that bounces on the absorption layer 508*a* a single time. The second group is ambient light that bounces on the absorption layer 508*a* at least two times. Because of the multiple bounces on absorption layer 508*a*, the reflection from this second group of ambient light is significantly reduced. For example, if the absorption layer 508*a* reflection is about 4 percent, because of the at least two bounces due to the microstructures 507*a*, the reflectivity of this second group of ambient light would be reduced to about 0.16 percent. To achieve more reduction of the reflection of total ambient light, it is desired that more incident ambient light fall into the second group. The percentage of ambient light for the first group is relative to the wall angle 512 ($\alpha_W$) of the microstructures 507*a*. The percentage of ambient light bouncing at least two times on the absorption layer 508*a* increases with an increase of the microstructure wall angle 512 ($\alpha_W$). In certain exemplary embodiments, the microstructure wall angle 512 ($\alpha_W$) is greater than about 30 degrees, greater than about 45 degrees, greater than about 60 degrees, or greater than about 75 degrees.

Figure 5B:
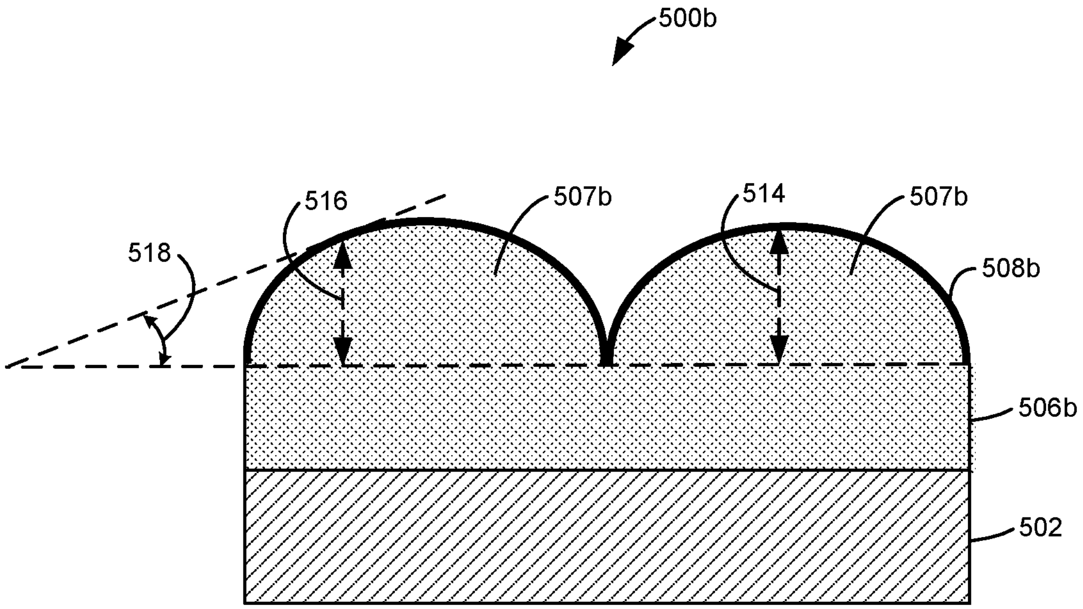

FIG. 5B is a cross-sectional view of a portion of an exemplary display 500*b* including a substrate 502 (e.g., TFT substrate), a microstructure layer 506*b*, and an absorption layer 508*b* as could be used in the displays of FIGS. 4A-4C. The microstructure layer 506*b* is arranged on the substrate 502. The absorption layer 508*b* is arranged on the microstructure layer 506*b*. In this embodiment, the absorption layer 508*b* is a conformal absorption layer. In certain exemplary embodiments, the absorption layer 508*b* includes a black polyimide or another suitable material. The microstructure layer 506*b* includes a plurality of microstructures 507*b*, which will be described in more detail below with reference to FIGS. 6D and 6F. In this embodiment, the microstructures 507*b* are domes or partial elliptical trenches. Each microstructure 507*b* of the microstructure layer 506*b* has a height ($H_m$) indicated at 514, such that $2H_m/3$ is indicated at 516. A microstructure wall angle 518 ($\alpha_W$) is defined by the surface slope at the location of ⅔ height ($H_m$) of a microstructure relative to a plane of a surface of the display. The percentage of ambient light bouncing at least two times on the absorption layer 508*b* increases with an increase of the microstructure wall angle 518 ($\alpha_W$). In certain exemplary embodiments, the microstructure wall angle 518 ($\alpha_W$) is greater than about 30 degrees, greater than about 45 degrees, greater than about 60 degrees, or greater than about 75 degrees.

Figure 6A:
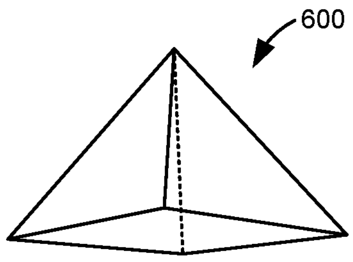
FIGS. 6A-6F are isometric views of exemplary microstructures for microstructure layers.
Figure 6B:
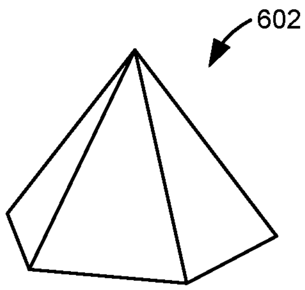
Figure 6C:
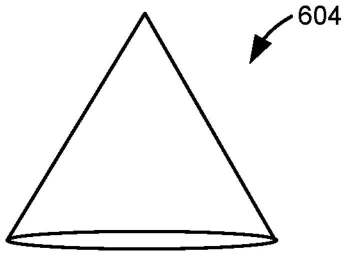
Figure 6D:
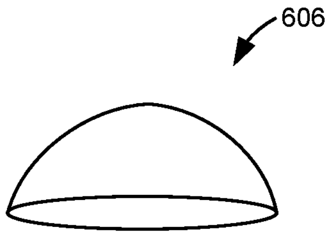
Figure 6E:
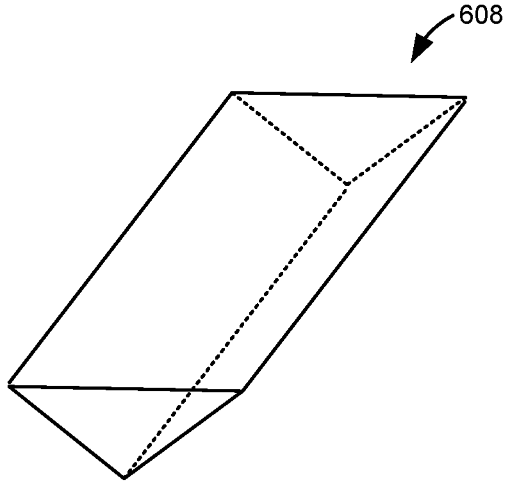
Figure 6F:
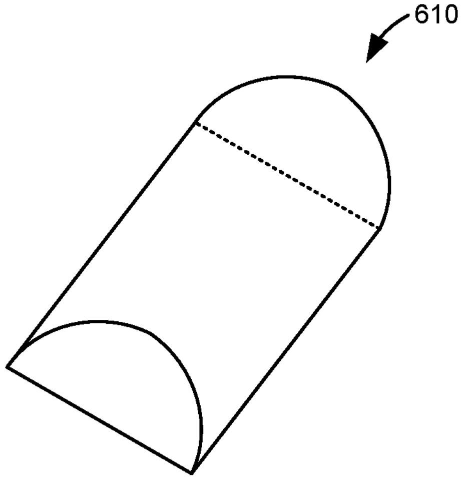

FIGS. 6A-6F are isometric views of exemplary microstructures for microstructure layers, such as microstructure layer 222 of FIGS. 2A-2C, microstructure layer 406 of FIGS. 4A-4C, and/or microstructure layer 430 of FIG. 4C. FIG. 6A is an isometric view of a four sided pyramid microstructure 600. In some embodiments, the length and the width of the base of microstructure 600 may be equal. In other embodiments, the length and the width of the base of microstructure 600 may be different. FIG. 6B is an isometric view of a six sided pyramid microstructure 602. In other examples, microstructure 602 may have 3, 5, 7, or more sides. FIG. 6C is an isometric view of a cone microstructure 604. The base of microstructure 604 may be circular or elliptical. FIG. 6D is an isometric view of a dome microstructure 606. The base of microstructure 606 may be circular or elliptical. FIG. 6E is an isometric view of a triangular trench microstructure 608. Each microstructure 608 may extend from one edge of a cover plate or substrate to another edge of the cover plate or substrate. FIG. 6F is an isometric view of a partial elliptical trench microstructure 610. Each microstructure 610 may extend from one edge of a cover plate or substrate to another edge of the cover plate or substrate. The dimensions of microstructures 600, 602, 604, 606, 608, and 610 of FIGS. 6A-6F may be consistent within a display or may vary in different areas of a display.

Figure 7A:
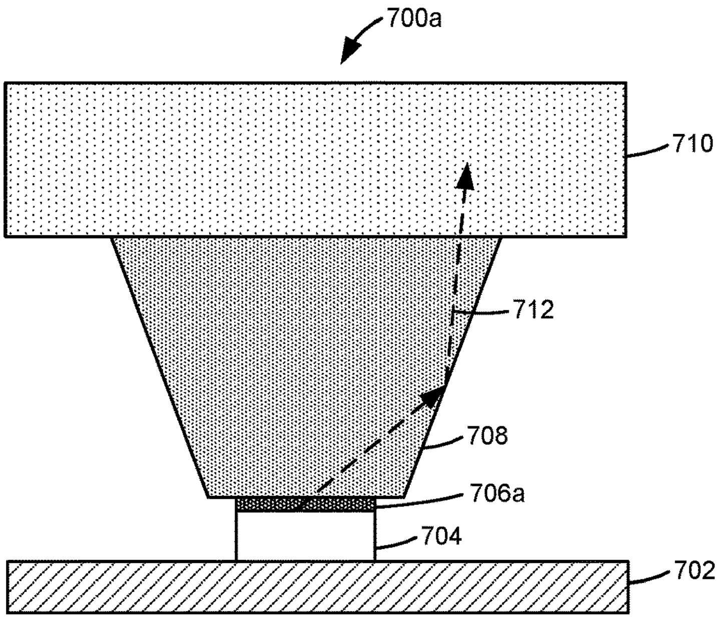
FIGS. 7A and 7B are simplified cross-sectional views of exemplary displays including focusing microstructures.

FIG. 7A is a simplified cross-sectional view of an exemplary display 700*a*. Display 700*a* includes a backplane 702, an array of light sources 704 (one light source 704 is visible in FIG. 7A), an optically clear adhesive 706*a* (e.g., phenyl silicone), an array of focusing microstructures 708 (one focusing microstructure 708 is visible in FIG. 7A), and a cover plate 710. The array of light sources 704 is electrically coupled to the backplane 702. The array of light sources 704 may include LEDs, mini-LEDs, microLEDs, or other suitable light sources. The array of focusing microstructures 708 are attached to the array of light sources 704 via the optically clear adhesive 706*a* and aligned with the array of light sources. The cover plate 710 is attached to the array of focusing microstructures 708. The cover plate 710 includes an optically clear layer, such as glass, or another optically clear material, such as plastic.

Figure 8A:
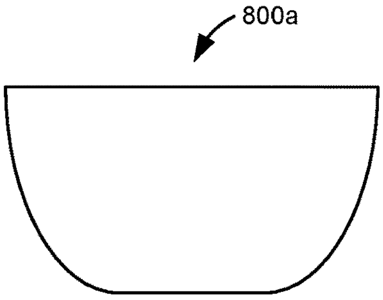
FIGS. 8A and 8B are cross-sectional views of exemplary shapes for the focusing microstructures as could be used in the displays of FIGS. 7A and 7B.
Figure 8B:
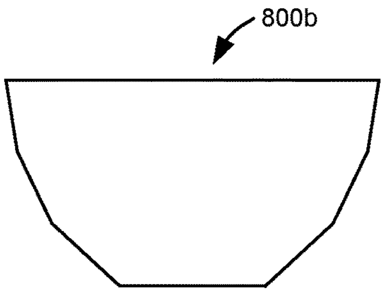

Each focusing microstructure 708 of the array of focusing microstructures may include an inverted truncated pyramid. As illustrated in FIG. 7A, the walls of the focusing microstructures 708 may be planer. In other examples, the focusing microstructures 708 may be replaced by focusing microstructures 800*a* as illustrated in FIG. 8A, where the walls of the focusing microstructures 800*a* are parabolic. In yet other examples, the focusing microstructures 708 may be replaced by focusing microstructures 800*b* as illustrated in FIG. 8B, where the walls of the focusing microstructures 800*b* are piecewise planer. In the embodiment of FIG. 7A, each focusing microstructure 708 of the array of focusing microstructures corresponds to a single light source 704 of the array of light sources. In other embodiments, however, as will be described below with reference to FIG. 10B, each focusing microstructure 708 may correspond to at least two light sources 704, such as 2, 3, or 4 light sources. In certain exemplary embodiments, each focusing microstructure 708 includes a refractive index greater than about 1.5.

Each focusing microstructure 708 focuses light rays as indicated at 712 to exit the display. Focusing microstructures 708 may enhance display brightness and contrast by enhancing light outcoupling while suppressing ambient light reflection. Focusing microstructures 708 enhance light outcoupling via a concave focusing mirror utilizing total internal reflection. Without a concave mirror micro-structure, if the light source 704 is simply optically bonded to the cover plate 710, more than half of the light source's output (all light rays that exit the light source at angles higher than the critical angle (e.g., about 42 degrees for many common types of cover plate materials with a refractive index equal to about 1.5)) may be trapped by total internal reflection from the outer surface of the cover plate at the interface with air. With the focusing microstructures 708 including micro-structures shaped as inverted truncated pyramids in place, light rays that originate at high angles are total internal reflected from the inclined pyramid walls and thus redirected at angles closer to normal.

An additional benefit to light outcoupling may be achieved by making the focusing microstructures 708 with a material having a high refractive index (e.g., greater than about 1.5) and optically coupling the focusing microstructures to the light sources. This may be achieved by gluing the light sources 704 to the focusing microstructures 708 using the optically clear adhesive 706*a* or fully embedding the light sources 704 in the adhesive. The optically clear adhesive 706*a* may have a refractive index equal to or greater than the refractive index of the focusing microstructures 708. In this case, the optically clear adhesive 706*a* becomes the new output medium for the light source (instead of air), which may reduce light trapping inside the light source.

In terms of geometry, the shape of each focusing microstructure 708 may be varied in a relatively wide range, while still keeping a substantial benefit to light outcoupling. In one example, the proportions of the focusing microstructure 708 b:h:w may equal about 1:1.5:2, where b is the smaller base size (b×b for the symmetric pyramid), his the height, and w is the larger base size. As an example, the pyramid could be about 5×5 micrometers at the narrow end, about 10×10 micrometers at the wide end, and about 7.5 micrometers tall. In other examples, the parameter ranges may include an aspect ratio (height/width) equal to between about 0.5 and about 5, a taper (larger base/smaller base) equal to between about 1.5 and about 4, and a side wall angle equal to between about 15 degrees and about 45 degrees.

Figure 7B:
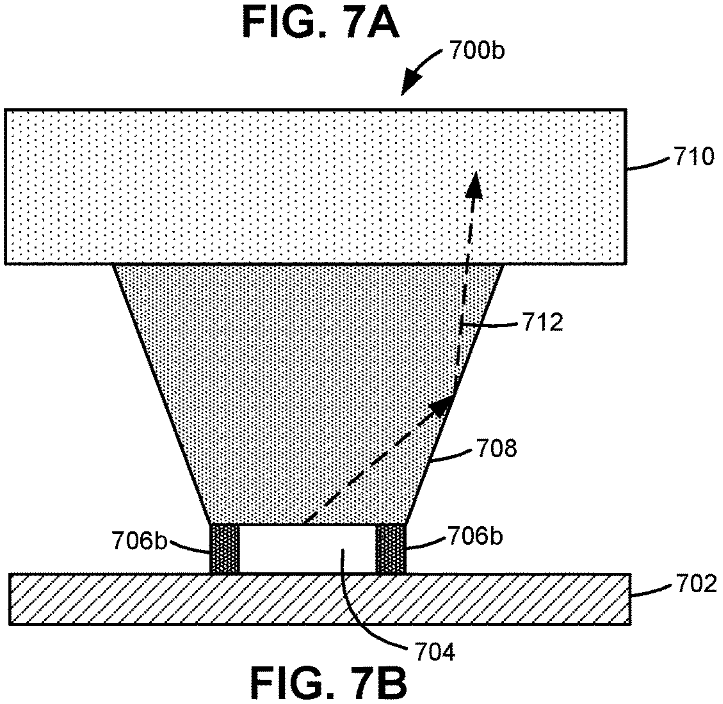

FIG. 7B is a simplified cross-sectional view of an exemplary display 700*b*. Display 700*b* is similar to display 700*a* of FIG. 7A, except that in display 700*b*, optically clear adhesive 706*a* is replaced by optically clear adhesive 706*b*. In this embodiment, optically clear adhesive 706*b* is arranged on the sides of each light source 704 and couples each focusing microstructure 708 to the corresponding light source 704 and the backplane 702.

Figure 9A:
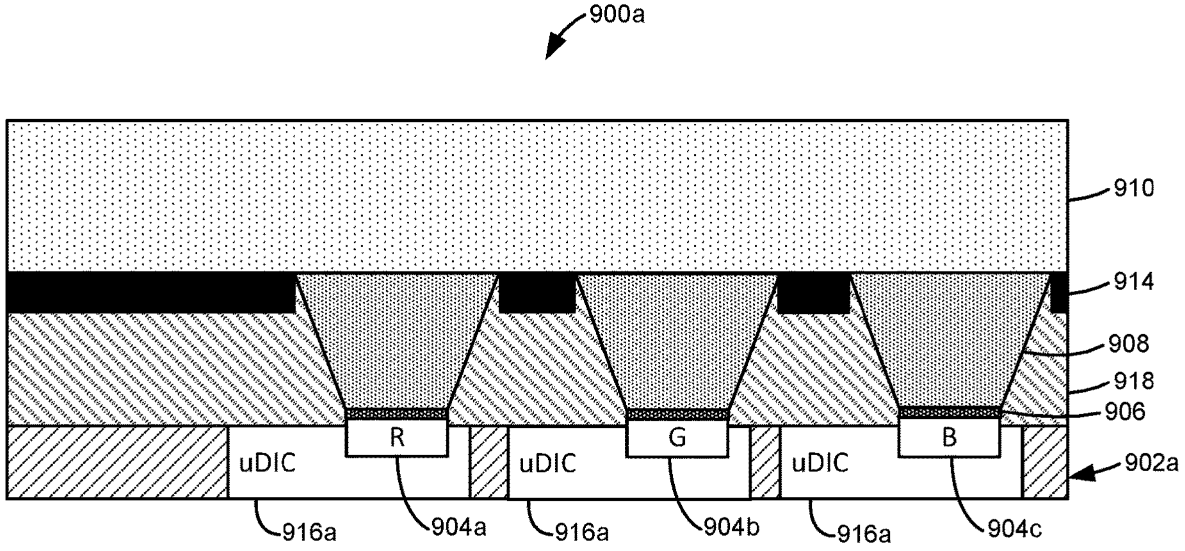
FIGS. 9A and 9B are simplified cross-sectional views of other exemplary displays including focusing microstructures.

FIG. 9A is a simplified cross-sectional view of another exemplary display 900*a*. Display 900*a* includes a backplane 902*a*, an array of light sources, an optically clear adhesive 906, an array of focusing microstructures 908, a cover plate 910, a contrast enhancement layer 914, and a planarization layer 918. The array of light sources includes red light sources 904*a*, green light sources 904*b*, and blue light sources 904*c*. Each light source 904*a*, 904*b*, and 904*c* of the array of light sources is coupled to the backplane 902*a*. Each light source 904*a*, 904*b*, and 904*c* of the array of light sources may include an LED, a mini-LED, a microLED, or another suitable light source. Each light source 904*a*, 904*b*, and 904*c* is electrically coupled to a corresponding micro-driver IC 916*a* for each light source. In this embodiment, three light sources 904*a*, 904*b*, and 904*c* provide each pixel of the display 900*a*.

Each focusing microstructure 908 is attached to a corresponding light source 904*a*, 904*b*, or 904*c* via the optically clear adhesive 906 and aligned with the corresponding light source. The cover plate 910 is attached to the array of focusing microstructures 908. The cover plate 910 includes an optically clear layer, such as glass or another optically clear material, such as plastic. The contrast enhancement layer 914 is between the focusing microstructures 908 on the bottom surface of the cover plate 910. The contrast enhancement layer 914 may include a thermally and chemically stable light absorbing material coated on the cover plate 910 to a thickness of several micrometers to tens of micrometers. In certain exemplary embodiments, the contrast enhancement layer 914 may include a black polyimide or another suitable material. In other embodiments, the contrast enhancement layer 914 includes a microstructure layer and an absorption layer as previously described and illustrated with reference to FIGS. 3A-3C. The planarization layer 918 is between the cover plate 910 and the backplane 902*a*.

Figure 9B:
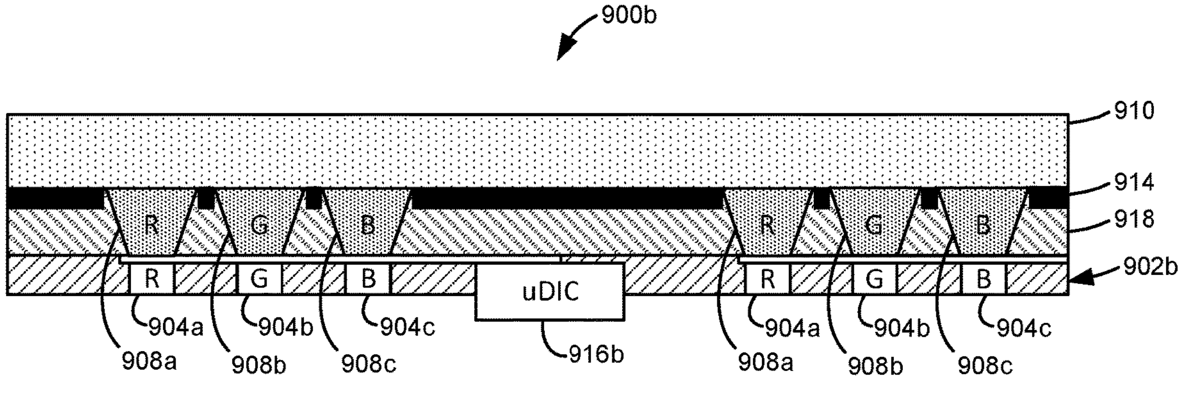

FIG. 9B is a simplified cross-sectional view of another exemplary display 900*b*. Display 900*b* is similar to display 900A of FIG. 9A, except that display 900*b* includes micro-driver ICs 916*b* in place of micro-driver ICs 916*a* and focusing microstructures 908*a*, 908*b*, and 908*c* in place of focusing microstructures 908. In this embodiment, each micro-driver IC 916*b* is electrically coupled to and controls three light sources 904*a*, 904*b*, and 904*c*. In addition, each focusing microstructure 908*a*, 908*b*, and 908*c* is colored (e.g., via dyes or pigments) to match the emission color of each corresponding light source 904*a*, 904*b*, and 904*c*, respectively. Thus, each focusing microstructure 908*a* is red, focusing microstructure 908*b* is green, and focusing microstructure 908*c* is blue. In this case, each focusing microstructure 908*a*, 908*b*, and 908*c* combines the functions of a reflective focusing element and a color filter. In other embodiments, in place of or in addition to colored focusing microstructures 908*a*, 908*b*, and 908*c*, absorptive color filters may be applied to the top surface (larger base) of each focusing microstructure.

Figure 10A:
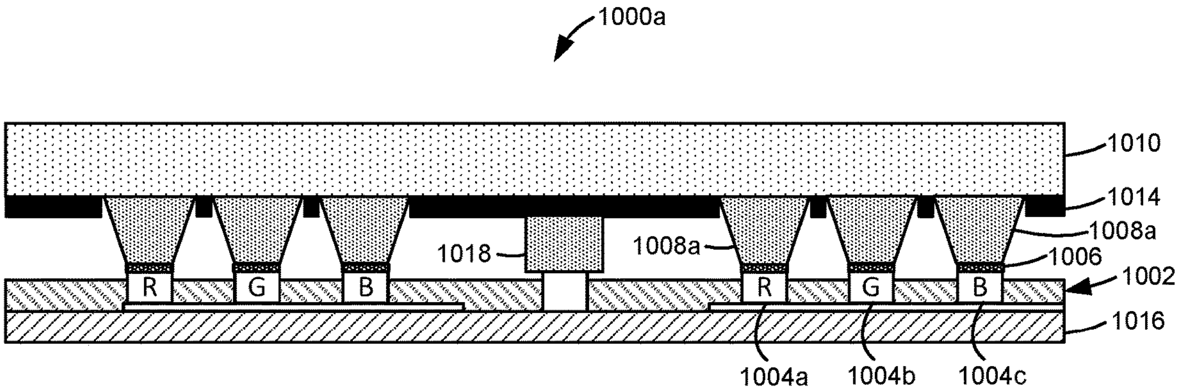
FIGS. 10A and 10B are simplified cross-sectional views of other exemplary displays including focusing microstructures.

FIG. 10A is a simplified cross-sectional view of another exemplary display 1000*a*. Display 1000*a* includes a backplane 1002, an array of light sources, an optically clear adhesive 1006, an array of focusing microstructures 1008*a*, a cover plate 1010, a contrast enhancement layer 1014, and an array of spacers 1018 (one spacer 1018 is visible in FIG. 10A). The array of light sources includes red light sources 1004*a*, green light sources 1004*b*, and blue light sources 1004*c*. Each light source 1004*a*, 1004*b*, and 1004*c* of the array of light sources is coupled to the backplane 1002. The backplane 1002 may include a TFT substrate 1016 for controlling the array of light sources. Each light source 1004*a*, 1004*b*, and 1004*c* of the array of light sources may include an LED, a mini-LED, a microLED, or another suitable light source. In this embodiment, three light sources 1004*a*, 1004*b*, and 1004*c* provide each pixel of the display 1000*a*.

Each focusing microstructure 1008*a* is attached to a corresponding light source 1004*a*, 1004*b*, or 1004*c* via the optically clear adhesive 1006 and aligned with the corresponding light source. The cover plate 1010 is attached to the array of focusing microstructures 1008*a*. The cover plate 1010 includes an optically clear layer, such as glass or another optically clear material, such as plastic. The contrast enhancement layer 1014 is between the focusing microstructures 1008 on the bottom surface of the cover plate 1010. In certain exemplary embodiments, the contrast enhancement layer 1014 includes a black polyimide or another suitable material. In other embodiments, the contrast enhancement layer 1014 includes a microstructure layer and an absorption layer as previously described and illustrated with reference to FIGS. 3A-3C. Each spacer 1018 is between the cover plate 1010 and the backplane 1002. The spacers 1018 provide additional structural support for the display 1000*a* between the pixels. In certain exemplary embodiments, the spacers 1018 may be made of the same material as focusing microstructures 1008*a*. To minimize mechanical stress on the light sources 1004*a*, 1004*b*, and 1004*c* and interconnects, the spacers 1018 may be applied to either the backplane 1002 or the cover plate 1010 with a thickness greater than the height of each focusing microstructure 1008*a* to absorb mechanical shock to the display surface.

Figure 10B:
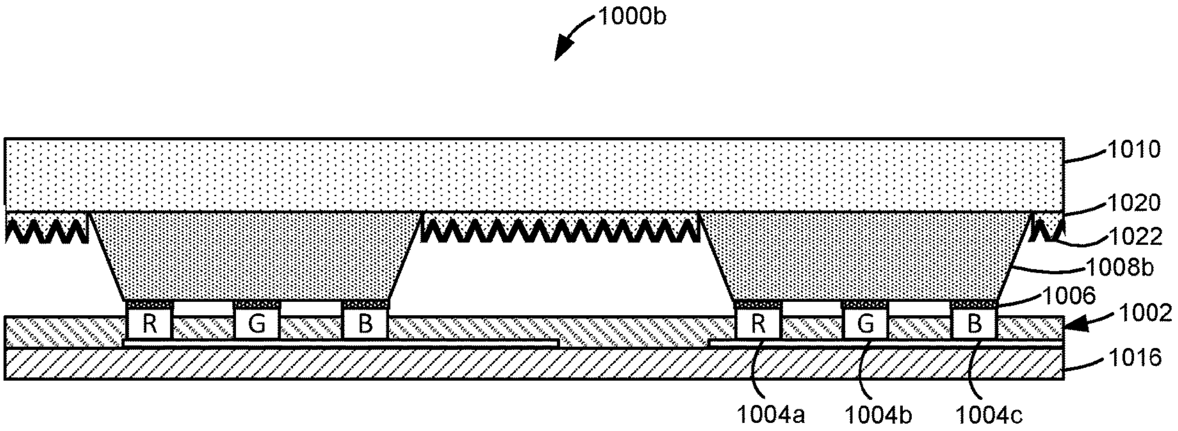

FIG. 10B is a simplified cross-sectional view of another exemplary display 1000*b*. Display 1000*b* includes a backplane 1002, an array of light sources, an optically clear adhesive 1006, and a cover plate 1010. In addition, display 1000*b* includes focusing microstructures 1008*b*, a microstructure layer 1020, and an absorption layer 1022. In this embodiment, each focusing microstructure 1008*b* corresponds to a pixel of the display 1000*b* including three light sources 1004*a*, 1004*b*, and 1004*c*. Microstructure layer 1020 and absorption layer 1022 are similar to the microstructure layer and the absorption layer previously described and illustrated with reference to FIGS. 3A-3C.

In this embodiment, a red, green, and blue light source are grouped together to form a pixel capable of producing an arbitrary color. If the red, green, and blue light sources are sufficiently small and are placed sufficiently close together, a single focusing microstructure **1008*b* as illustrated in FIG. 10B may be optically connected to the entire group forming the color pixel. The dimensions of the focusing microstructures described with reference to FIG. 7A apply to focusing microstructures 1008*b***, with the exception that the smaller base of the truncated pyramid be equal to or larger than the combined size of the light source group.

In other embodiments, the light sources may be blue semiconductor diodes used in combination with a phosphor (e.g., quantum dot or other) type layer. In this case, the dimensions of the focusing microstructures described with reference to FIG. 7A still apply, except that the optically clear adhesive is bonded to or encapsulates the phosphor layer.

Figure 11A:
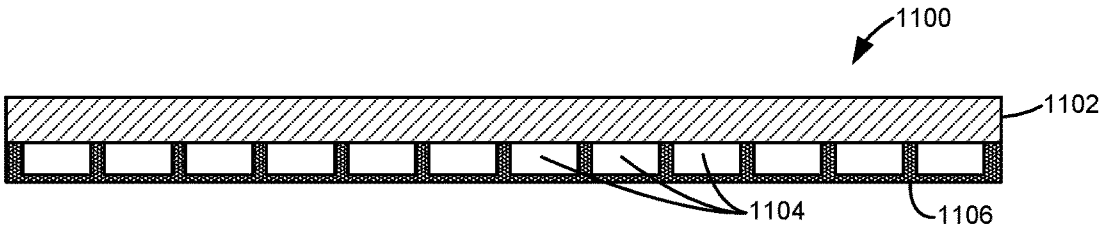
FIGS. 11A-11H are cross-sectional views of an exemplary method for fabricating a display including focusing microstructures.

FIGS. 11A-11H are cross-sectional views of an exemplary method for fabricating a display including focusing microstructures. FIG. 11A is a cross-sectional view of an exemplary light source wafer 1100. Light source wafer 1100 includes a substrate 1102, a plurality of light sources 1104, and an adhesive material 1106. Each light source 1104 may be an LED, a mini-LED, a microLED, or another suitable light source. Each light source 1104 may be fabricated on the substrate 1102. The adhesive material 1106 is applied over the exposed portions of the light sources 1104 and the substrate 1102. In certain exemplary embodiments, the adhesive material 1106 may be a curable adhesive material. In certain exemplary embodiments, the density of the light sources 1104 on the substrate 1102 is greater than the density of the light sources in the completed display in which the light sources are to be arranged.

Figure 11B:
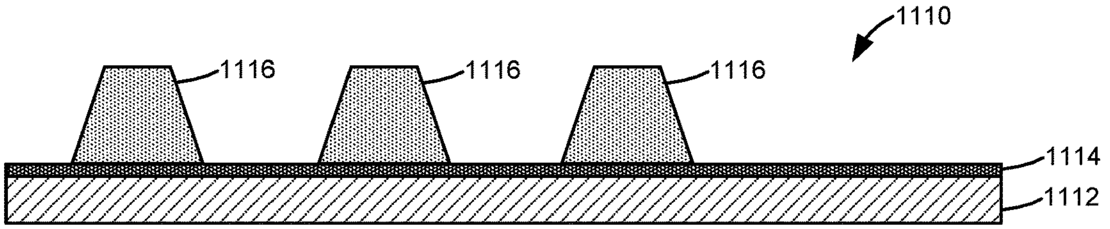

FIG. 11B is a cross-sectional view of a focusing microstructure transfer carrier 1110. The focusing microstructure transfer carrier 1110 includes a transfer carrier 1112, a temporary adhesive layer 1114, and a plurality of focusing microstructures 1116. The focusing microstructures 1116 may be fabricated using photolithography or embossing and etching on the transfer carrier 1112 coated with the temporary adhesive layer 1114.

Figure 11C:
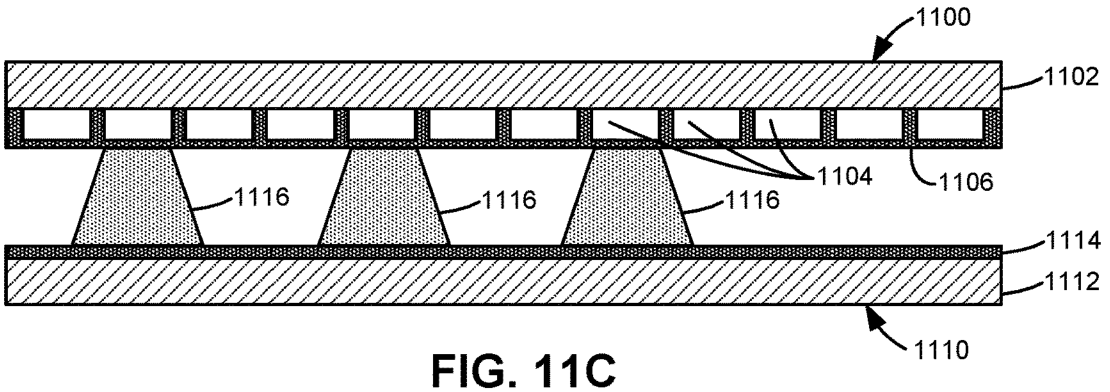

FIG. 11C is a cross-sectional view of the light source wafer 1100 of FIG. 11A brought into contact with the focusing microstructure transfer carrier 1110 of FIG. 11B. The light source wafer 1100 is aligned with the focusing microstructure transfer carrier 1110 such that each focusing microstructure 1116 is aligned with a light source 1104 of the light source wafer 1100. A permanent bond is formed between each focusing microstructure 1116 aligned with a light source 1104 (e.g., via adhesive 1106). In other embodiments, the adhesive 1106 may be replaced by a transparent conductor, which may be bonded by ACF, laser welding, or other suitable processes.

Figure 11D:
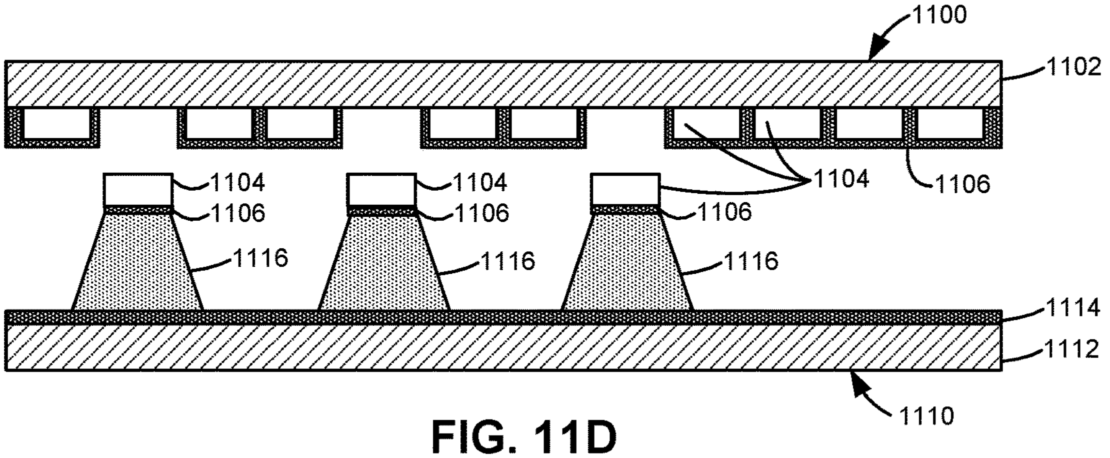

FIG. 11D is a cross-sectional view after separating the light source wafer 1100 from the focusing microstructure transfer carrier 1110 after being brought into contact as illustrated in FIG. 11C. A laser liftoff process or another suitable process may be used to separate the light sources 1104 from the light source wafer 1100. The steps illustrated in FIGS. 11C and 11D may be repeated to transfer other light sources 1104 from light source wafer 1100 to focusing microstructures 1116.

Figure 11E:
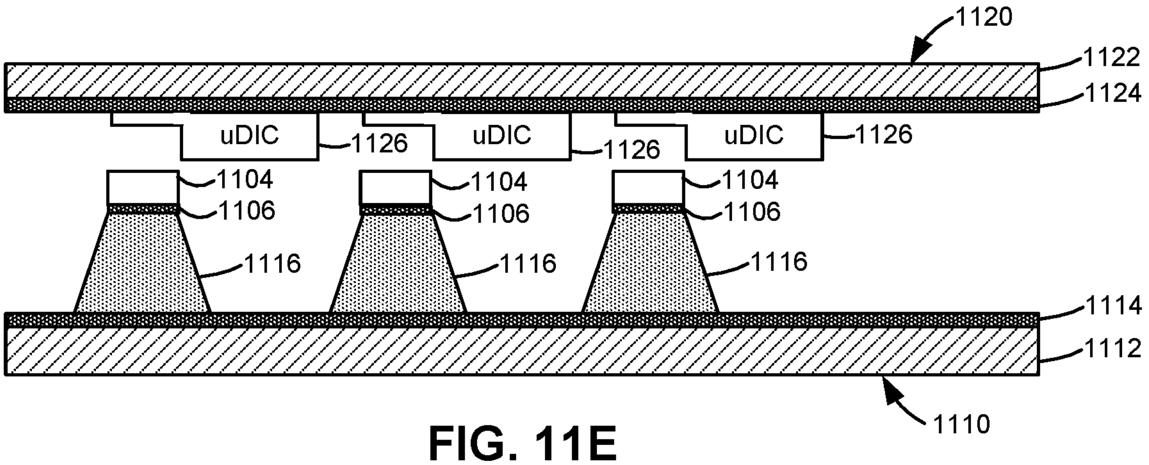

FIG. 11E is a cross-sectional view of a micro-driver IC transfer carrier 1120 just prior to contact with the light source wafer 1110 after light sources 1104 are bonded to the focusing microstructures 1104 as illustrated in FIG. 11D. The micro-driver IC transfer carrier 1120 includes a transfer carrier 1122, a temporary adhesive 1124, and a plurality of micro-driver ICs 1126. Each micro-driver IC 1126 is aligned with a corresponding light source 1104.

Figure 11F:
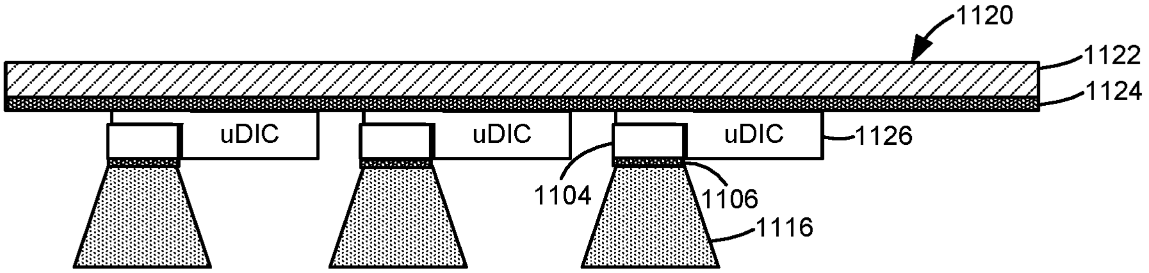

FIG. 11F is a cross-sectional view of the micro-driver IC transfer carrier 1120 after permanently bonding each micro-driver IC 1126 to a corresponding light source 1104 and after removing the transfer carrier 1112 and adhesive layer 1114 from the focusing microstructures 1116.

Figure 11G:
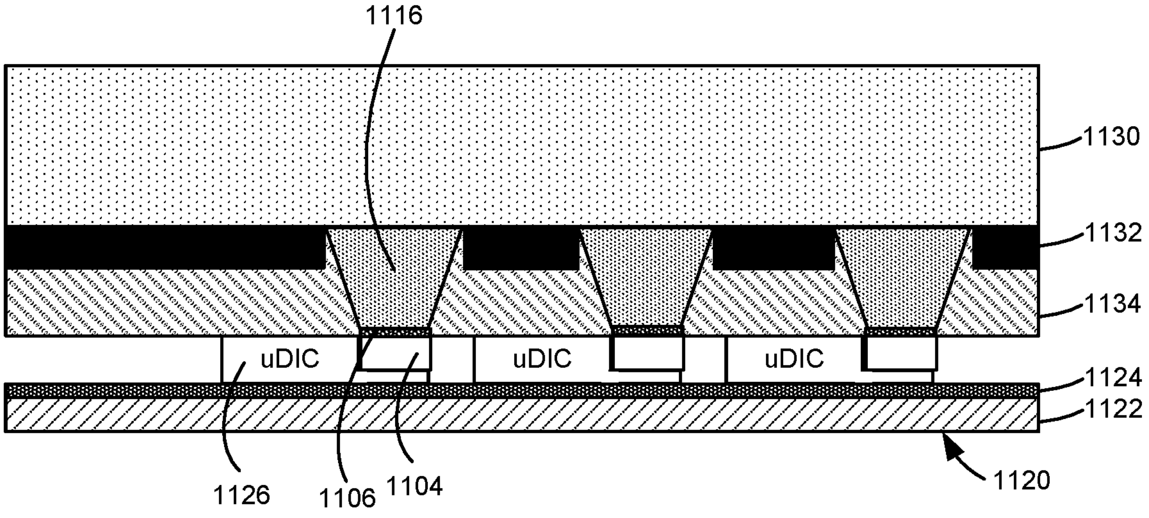

FIG. 11G is a cross-sectional view of the micro-driver IC transfer carrier 1120 with attached light sources 1104 and focusing microstructures 1116 of FIG. 11F attached to a cover plate 1130 with a contrast enhancement layer 1132 on the cover plate. The focusing microstructures 1116 are permanently bonded to the cover plate 1130 through openings in the contrast enhancement layer 1132. A planarization layer 1134 may be formed between the micro-driver IC carrier 1120 and the cover plate 1130.

Figure 11H:
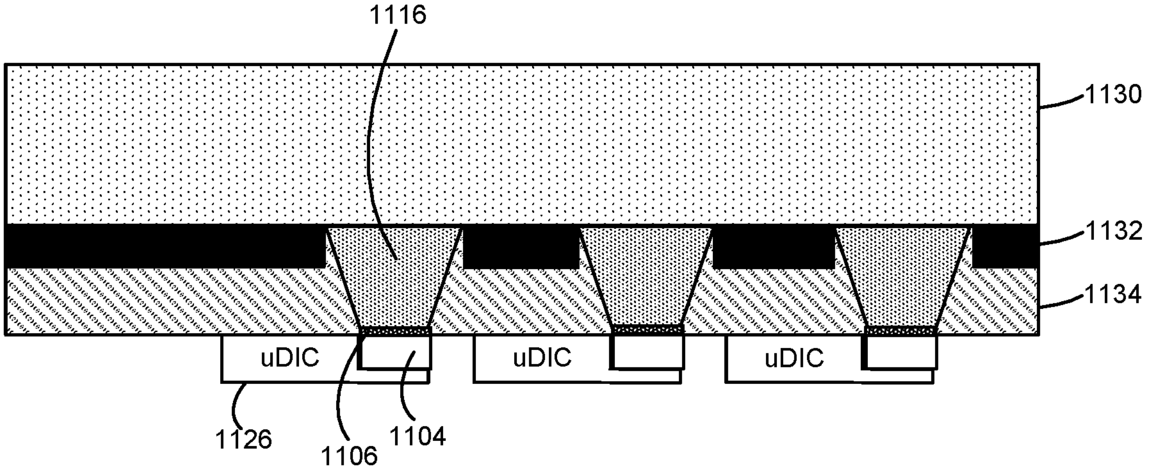

FIG. 11H is a cross-sectional view after removing the transfer carrier 1122 and the adhesive layer 1124 of FIG. 11G. With the transfer carrier 1122 and the adhesive layer 1124 removed, the planarization layer 1134 and metallization layers may be interconnected between the light sources 1104 and/or micro-driver ICs 1126 to backplane electrodes.

The fabrication method of FIGS. 11A-11H provides several advantages. The focusing microstructures act first as a transfer pick up to transfer, at the wafer level, the light sources from a wafer or carrier source to permanently optically bond the light sources with precise alignment. In the embodiment of bonding to a micro-driver IC assembly, this alignment and bonding is also accomplished at the wafer level and eliminates the need for a separate transfer step to invert the orientation of the focusing microstructures. In this way, precise optical alignment and strong electrical and mechanical bonding may be achieved. In addition, the focusing microstructures may be fabricated in high resolution wafer fabs to achieve precise feature dimensions, add colorants, etc. in high density arrays compatible with transfer from light source wafers. In other embodiments, focusing microstructures may be transferred or formed on the receiving substrate, then light sources and/or micro-driver ICs may be transferred and attached to the focusing microstructures.

Given that for microLED with micro-driver IC device designs, transfer and assembly processes are closer to printing than to large scale deposition processes, the process cost is less driven by scale as long as the printing platform is large enough for the intended application. Yields and materials costs become important drivers. Thus, a display may be fabricated directly on the underside surface of an ion-exchanged cover glass, eliminating the need and cost for a display substrate, without compromising the strength or reliability of the cover glass. To enable fabrication directly on the underside surface of a cover glass, the display and other electronics (e.g., touch panel) should continue to function in the event that the cover glass is cracked or damaged. In addition, the cover glass, device design, and material selection may be optimized such that process yields are equivalent or better than can be achieved on incumbent display substrates. Further, where possible, material functions may be combined to reduce overall cost or complexity of the process.

The cover glass material may have high durability, high flatness, low thickness variation, and other attributes desirable to the manufacturing process. Hence, fusion formed Gorilla® Glass and strengthened glass ceramics may be used. As any substrate will break under sufficient applied forces, it is also desirable for applications such as mobile devices, that the display electronics be protected and continue to function in the event that the cover is damaged or cracked. Hence, an interface layer or layers may be used between the cover glass and the electronics to protect the display. This layer or layers should be compatible with the process conditions for fabricating the display. With appropriate thicknesses, coatings (e.g., clear polyimide, black polyimide, etc.) can provide mechanical protection to most shocks and are compatible with process temperatures of at least about 250 degrees Celsius and are stable to chemicals in the process. A combination of clear polyimide with black polyimide, or black polyimide, which provide sufficient thermal and mechanical stability, patterned with apertures either clear or with color filter elements offer particular advantages to improve the ambient light contrast. Optical features may be patterned, for example, by hot embossing or other means.

Figure 12A:
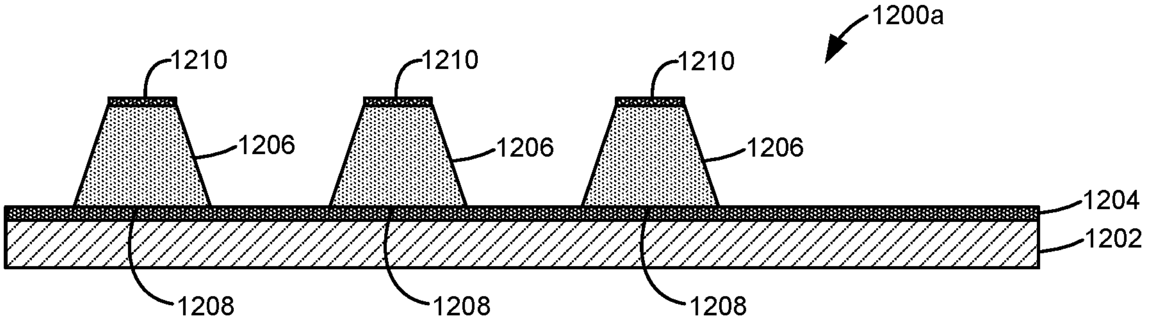
FIGS. 12A and 12B are cross-sectional views of exemplary transfer carriers as could be used in the method of FIGS. 11A-11H.

FIG. 12A is a cross-sectional view of an exemplary transfer carrier 1200*a* as could be used in the method of FIGS. 11A-11H. Transfer carrier 1200*a* includes a substrate 1202, a temporary adhesive layer 1204, and an array of focusing microstructures 1206. The temporary adhesive layer 1204 is attached to the substrate 1202. The array of focusing microstructures 1206 each include a first surface 1208 attached to the temporary adhesive layer 1204. In certain exemplary embodiments, a permanent adhesive layer 1212 may be attached to a second surface 1210 of each focusing microstructure 1206. Each focusing microstructure 1206 may include a truncated pyramid. The walls of the truncated pyramid may be planer, parabolic, or piecewise planer as previously described with reference to FIGS. 7A-8B. Each focusing microstructure 1206 may include a refractive index greater than about 1.5. A spacing between each focusing microstructure 1206 of the array of focusing microstructures may be greater than a spacing between light sources on a light source wafer from which selected light sources are configured to be permanently bonded to the array of focusing microstructures.

Figure 12B:
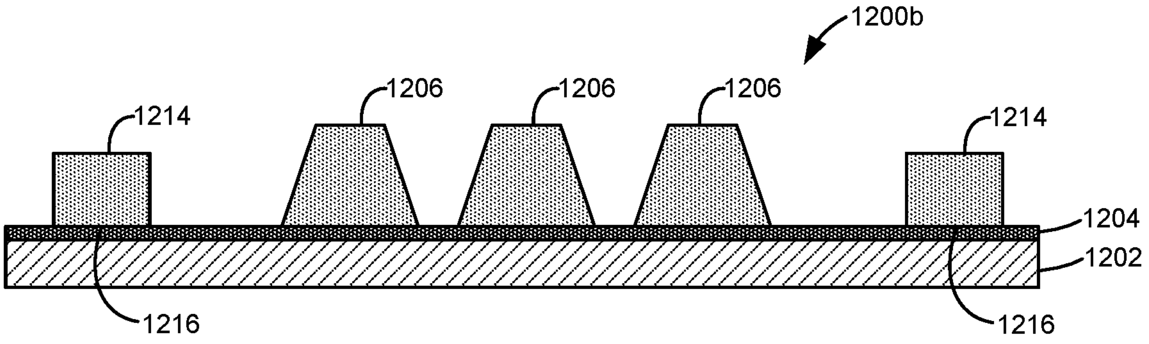

FIG. 12B is a cross-sectional view of another exemplary transfer carrier 1200*b* as could be used in the method of FIGS. 11A-11H. Transfer carrier 1200*b* include the substrate 1202, the temporary adhesive layer 1204, and the focusing microstructures 1206 of FIG. 12A. In addition, transfer carrier 1200*b* includes an array of spacers 1214. Each spacer 1214 includes a first surface 1216 attached to the temporary adhesive layer 1204. The spacers may provide additional structural support to a display as previously described with reference to FIG. 10A.

Figure 13A:
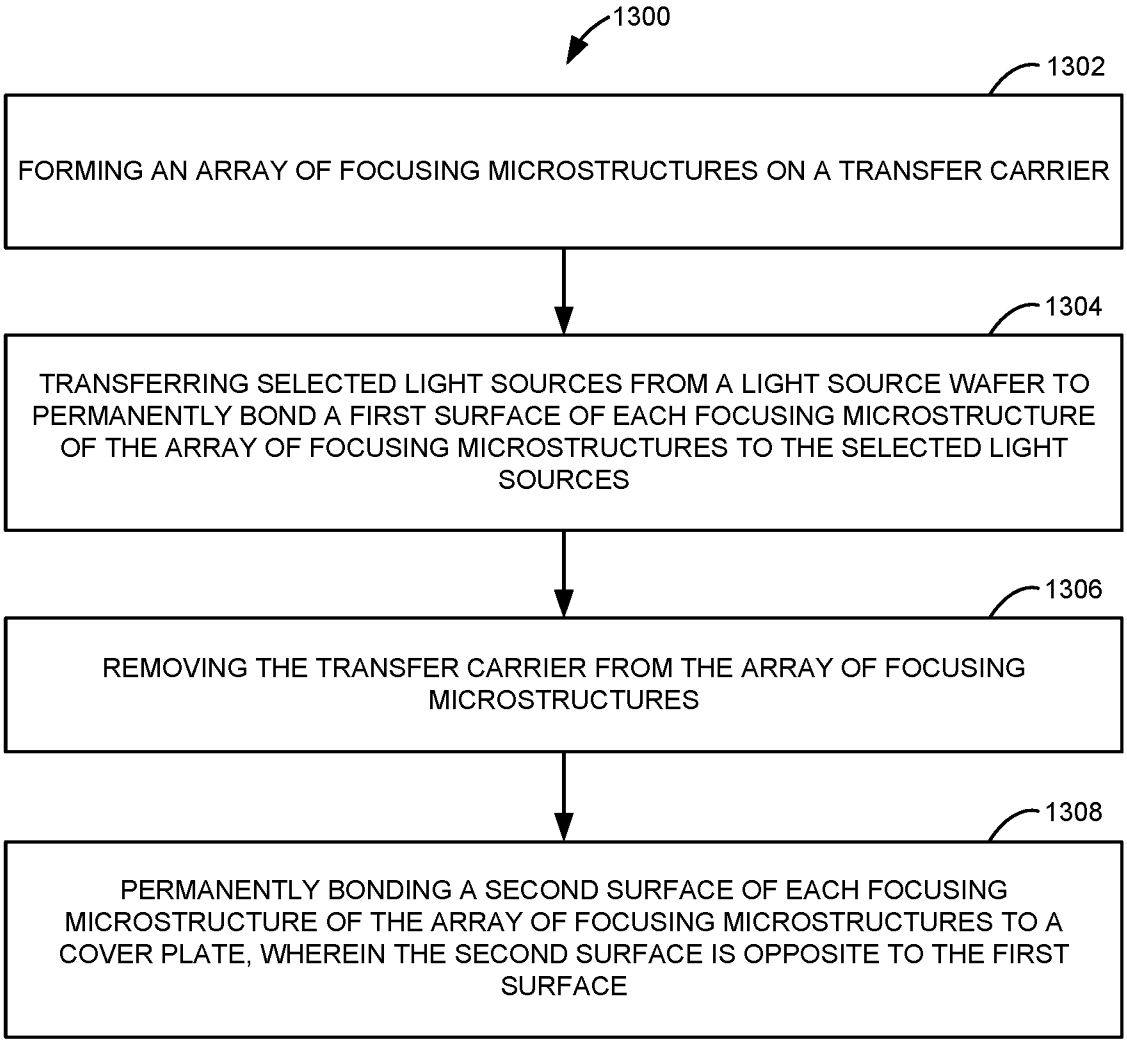
FIGS. 13A-13D are flow diagrams illustrating an exemplary method for fabricating a display including an array of focusing microstructures.

FIGS. 13A-13D are flow diagrams illustrating an exemplary method 1300 for fabricating a display including an array of focusing microstructures, such as display 900*a*, 900*b*, 1000*a*, or 1000*b* of FIGS. 9A-10B. As illustrated in FIG. 13A at 1302, method 1300 includes forming an array of focusing microstructures (e.g., 1116 of FIG. 11B) on a transfer carrier (e.g., 1112 of FIG. 11B). At 1304, method 1300 includes transferring selected light sources from a light source wafer (e.g., 1110 of FIG. 11A) to permanently bond a first surface of each focusing microstructure of the array of focusing microstructures to the selected light sources (e.g., as illustrated in FIGS. 11C-11D). At 1306, method 1300 includes removing the transfer carrier from the array of focusing microstructures (e.g., as illustrated in FIG. 11F). At 1308, method 1300 includes permanently bonding a second surface of each focusing microstructure of the array of focusing microstructures to a cover plate, wherein the second surface is opposite to the first surface (e.g., as illustrated in FIG. 11G).

Figure 13B:
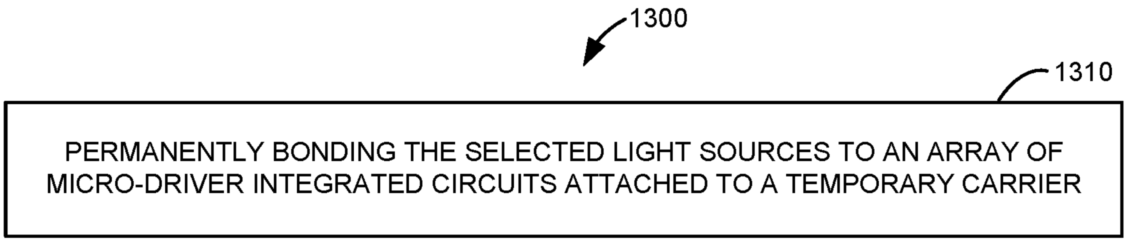
Figure 13C:
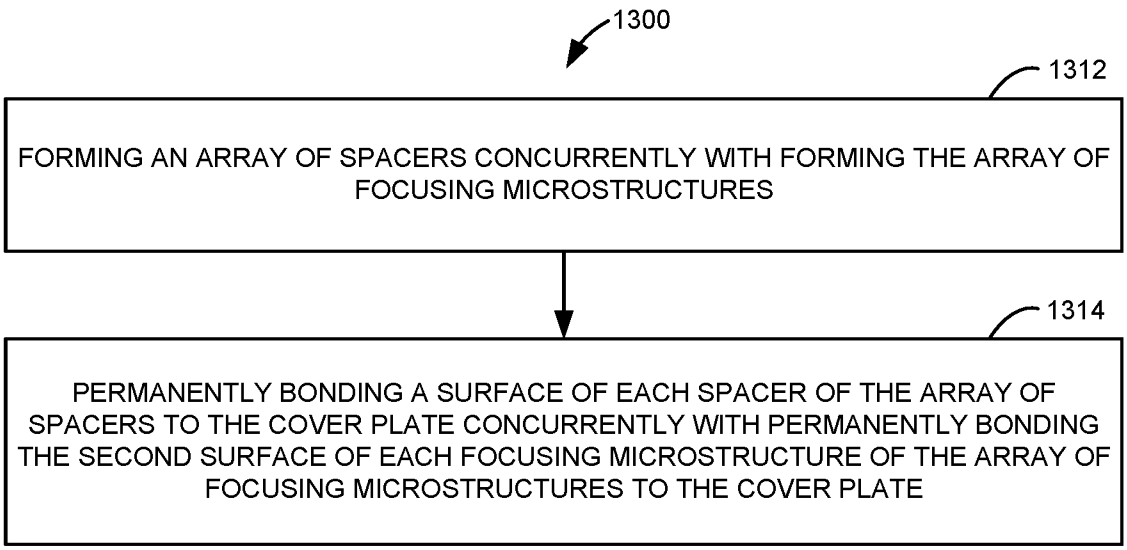
Figure 13D:
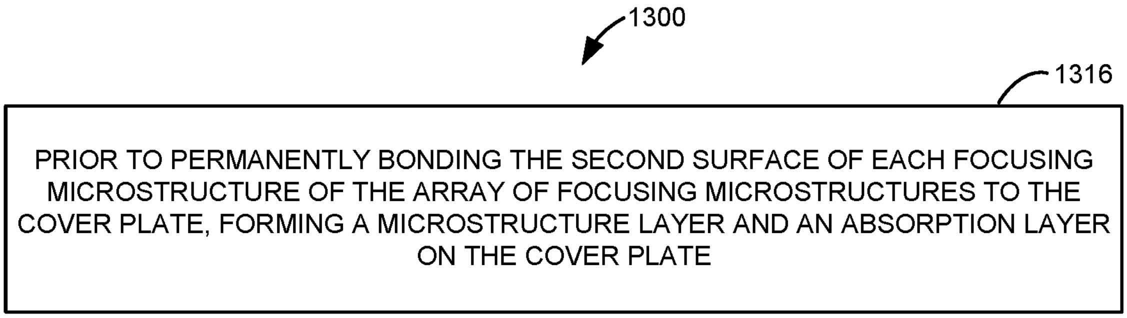

As illustrated in FIG. 13B at 1310, method 1300 may further include permanently bonding the selected light sources to an array of micro-driver integrated circuits attached to a temporary carrier (e.g., as illustrated in FIGS. 11E and 11F). As illustrated in FIG. 13C, method 1300 may further include forming an array of spacers (e.g., 1214 of FIG. 12B) concurrently with forming the array of focusing microstructures (e.g., as illustrated in FIG. 12B). At 1314, method 1300 may further include permanently bonding a surface of each spacer of the array of spacers to the cover plate concurrently with permanently bonding the second surface of each focusing microstructure of the array of focusing microstructures to the cover plate. As illustrated in FIG. 13D at 1316, method 1300 may further include prior to permanently bonding the second surface of each focusing microstructure of the array of focusing microstructures to the cover plate, forming a microstructure layer (e.g., 1020 of FIG. 10B) and an absorption layer (e.g., 1022 of FIG. 10B) on the cover plate.

It will be apparent to those skilled in the art that various modifications and variations can be made to embodiments of the present disclosure without departing from the spirit and scope of the disclosure. Thus, it is intended that the present disclosure cover such modifications and variations provided they come within the scope of the appended claims and their equivalents.

What is claimed is:

1. A display comprising:

a backplane;

an array of light sources coupled to the backplane; and a cover plate arranged over the array of light sources, the cover plate comprising a first side facing the array of light sources and a second side opposite to the first side, wherein the cover plate comprises:

a microstructure layer arranged on the first side of the cover plate; and an absorption layer arranged on the microstructure layer facing the array of light sources; and wherein the cover plate comprises an array of openings aligned with the array of light sources extending through the microstructure layer and the absorption layer.

2. The display of claim 1, wherein the array of light sources comprises an array of micro light emitting diodes (microLEDs).

3. The display of claim 1, wherein the cover plate comprises an optically clear laminate structure.

4. The display of claim 1, wherein the microstructure layer comprises a plurality of pyramids, cones, domes, or trenches.

5. The display of claim 1, wherein the microstructure layer comprises microstructures comprising surfaces that form an angle to a plane of a surface of the display greater than about 45 degrees.

6. A light emitting diode (LED) display comprising:

a backplane;

an array of LEDs coupled to the backplane;

an array of focusing microstructures attached to the array of LEDs and aligned with the array of LEDs; and a cover plate attached to the array of focusing microstructures; and wherein the cover plate comprises:

a microstructure layer facing the array of LEDS:

an absorption layer arranged on the microstructure layer facing the array of LEDs; and an array of openings aligned with the array of focusing microstructures extending through the microstructure layer and the absorption layer.

7. The LED display of claim 6, wherein each focusing microstructure of the array of focusing microstructures comprises an inverted truncated pyramid.

8. A method for fabricating a display, the method comprising:

forming an array of focusing microstructures on a transfer carrier;

transferring selected light sources from a light source wafer to permanently bond a first surface of each focusing microstructure of the array of focusing microstructures to the selected light sources;

removing the transfer carrier from the array of focusing microstructures; and permanently bonding a second surface of each focusing microstructure of the array of focusing microstructures to a cover plate, wherein the second surface is opposite to the first surface.

9. The method of claim 8, further comprising:

permanently bonding the selected light sources to an array of micro-driver integrated circuits attached to a temporary carrier.

10. The method of claim 8, further comprising:

forming an array of spacers concurrently with forming the array of focusing microstructures; and permanently bonding a surface of each spacer of the array of spacers to the cover plate concurrently with permanently bonding the second surface of each focusing microstructure of the array of focusing microstructures to the cover plate.

11. The method of claim 8, further comprising:

prior to permanently bonding the second surface of each focusing microstructure of the array of focusing microstructures to the cover plate, forming a microstructure layer and an absorption layer on the cover plate.

* * * * *